(12) United States Patent
Xu et al.

(10) Patent No.: US 11,296,285 B2
(45) Date of Patent: Apr. 5, 2022

(54) FLEXIBLE SUBSTRATE AND METHOD FOR MANUFACTURING SAME, AND FLEXIBLE DISPLAY SUBSTRATE AND METHOD FOR MANUFACTURING SAME

(71) Applicants: Chengdu BOE Optoelectronics Technology Co., Ltd., Sichuan (CN); BOE Technology Group Co., Ltd., Beijing (CN)

(72) Inventors: Baoqiang Xu, Beijing (CN); Xiangnan Wang, Beijing (CN); Qiang Wen, Beijing (CN); Jianjun Tan, Beijing (CN); Haitao Yi, Beijing (CN)

(73) Assignees: Chengdu BOE Optoelectronics Technology Co., Ltd., Sichuan (CN); BOE Technology Group Co., Ltd., Beijing (CN)

( * ) Notice: Subject to any disclaimer, the term of this patent is extended or adjusted under 35 U.S.C. 154(b) by 0 days.

(21) Appl. No.: 16/709,000

(22) Filed: Dec. 10, 2019

(65) Prior Publication Data
US 2020/0266369 A1    Aug. 20, 2020

(30) Foreign Application Priority Data
Feb. 19, 2019    (CN) .......................... 201910124040.X

(51) Int. Cl.
*H01L 51/00* (2006.01)
*H01L 27/32* (2006.01)
*H01L 51/56* (2006.01)

(52) U.S. Cl.
CPC ...... *H01L 51/0097* (2013.01); *H01L 27/3244* (2013.01); *H01L 51/003* (2013.01);
(Continued)

(58) Field of Classification Search
None
See application file for complete search history.

(56) References Cited

U.S. PATENT DOCUMENTS

| | | | |
|---|---|---|---|
| 6,737,753 B2* | 5/2004 | Kumar | H01L 51/5237 257/758 |
| 9,039,476 B2* | 5/2015 | Song | H01L 51/5237 445/24 |

(Continued)

FOREIGN PATENT DOCUMENTS

| | | |
|---|---|---|
| CN | 104377165 A | 2/2015 |
| CN | 105552247 A | 5/2016 |

(Continued)

OTHER PUBLICATIONS

First office action of Chinese application No. 201910124040.X dated Oct. 30, 2020.

*Primary Examiner* — J. E. Schoenholtz
(74) *Attorney, Agent, or Firm* — Fay Sharpe LLP

(57) ABSTRACT

The present disclosure discloses a flexible substrate and a method for manufacturing the same, and a flexible display substrate and a method for manufacturing the same. The method for manufacturing the flexible substrate includes: sequentially forming a first flexible substrate layer and a first inorganic layer on a rigid base substrate; forming a second flexible substrate layer on a side of the first inorganic layer distal from the first flexible substrate layer, an orthographic projection of the second flexible substrate layer on the first flexible substrate layer being located within the first flexible substrate layer; and stripping off the rigid base substrate to obtain the flexible substrate. The method solves the problem of poor process of the flexible substrate.

18 Claims, 28 Drawing Sheets

(52) U.S. Cl.
 CPC ........ *H01L 51/56* (2013.01); *B32B 2307/546* (2013.01); *H01L 2227/326* (2013.01); *H01L 2251/5338* (2013.01)

(56) References Cited

U.S. PATENT DOCUMENTS

| | | | |
|---|---|---|---|
| 10,360,825 B1* | 7/2019 | Wu | H01L 29/78603 |
| 2014/0170787 A1* | 6/2014 | Burrows | H01L 51/5246 |
| | | | 438/27 |
| 2014/0323006 A1* | 10/2014 | Song | H01L 51/5256 |
| | | | 445/24 |
| 2015/0044442 A1 | 2/2015 | Huang et al. | |
| 2015/0123098 A1* | 5/2015 | Kang | H01L 27/3244 |
| | | | 257/40 |
| 2017/0077459 A1* | 3/2017 | Choi | H01L 21/6838 |
| 2017/0092885 A1 | 3/2017 | Sakuishi et al. | |
| 2017/0162825 A1 | 6/2017 | Xiao et al. | |
| 2018/0375060 A1* | 12/2018 | Li | H01L 51/5259 |
| 2019/0333425 A1* | 10/2019 | Yasuda | H01L 27/1218 |
| 2020/0006701 A1* | 1/2020 | Lee | H01L 27/3223 |

FOREIGN PATENT DOCUMENTS

| | | |
|---|---|---|
| CN | 107195643 A | 9/2017 |
| CN | 108365094 A | 8/2018 |
| CN | 108695446 A | 10/2018 |

\* cited by examiner

FLEXIBLE SUBSTRATE AND METHOD FOR MANUFACTURING SAME, AND FLEXIBLE DISPLAY SUBSTRATE AND METHOD FOR MANUFACTURING SAME

This application claims priority to Chinese Patent Application No. 201910124040.X, filed on Feb. 19, 2019 and entitled "FLEXIBLE SUBSTRATE AND METHOD FOR MANUFACTURING SAME, AND FLEXIBLE DISPLAY SUBSTRATE AND METHOD FOR MANUFACTURING SAME", the entire contents of which are incorporated herein by reference.

TECHNICAL FIELD

The present disclosure relates to a flexible substrate and a method for manufacturing the same, and a flexible display substrate and a method for manufacturing the same.

BACKGROUND

With the development of display technologies, various display devices have emerged. Flexible organic light-emitting diode (OLED) display devices are widely used in the display industry due to the advantages of light weight, thinness, low power consumption, high contrast, high color gamut and the like.

SUMMARY

The present disclosure provides a flexible substrate and a method for manufacturing the same, and a flexible display substrate and a method for manufacturing the same. The technical solutions of the present disclosure are as follows.

In one aspect, a method for manufacturing a flexible substrate is provided. The method includes:

sequentially forming a first flexible substrate layer and a first inorganic layer on a rigid base substrate;

forming a second flexible substrate layer on a side of the first inorganic layer distal from the first flexible substrate layer, an orthographic projection of the second flexible substrate layer on the first flexible substrate layer being located within the first flexible substrate layer; and stripping off the rigid base substrate to obtain the flexible substrate.

Optionally, the forming the second flexible substrate layer on the side of the first inorganic layer distal from the first flexible substrate layer includes:

forming a first substrate solution layer on the side of the first inorganic layer distal from the first flexible substrate layer, an area of the first substrate solution layer being smaller than an area of the first flexible substrate layer, and an orthographic projection of the first substrate solution layer on the first flexible substrate layer being located within the first flexible substrate layer; and drying the first substrate solution layer to obtain the second flexible substrate layer.

Optionally, upon the forming the second flexible substrate layer on the side of the first inorganic layer distal from the first flexible substrate layer, the method further includes:

forming a second inorganic layer on a side of the second flexible substrate layer distal from the first inorganic layer.

Optionally, upon the forming the second inorganic layer on the side of the second flexible substrate layer distal from the first inorganic layer, the method further includes:

forming a third flexible substrate layer on a side of the second inorganic layer distal from the second flexible substrate layer, an orthographic projection of the third flexible substrate layer on the first flexible substrate layer being located within the orthographic projection of the second flexible substrate layer on the first flexible substrate layer; and forming a third inorganic layer on a side of the third flexible substrate layer distal from the second inorganic layer.

Optionally, the forming the third flexible substrate layer on the side of the second inorganic layer distal from the second flexible substrate layer, includes:

forming a second substrate solution layer on the side of the second inorganic layer distal from the second flexible substrate layer, an area of the second substrate solution layer being smaller than an area of the second flexible substrate layer, and an orthographic projection of the second substrate solution layer on the first flexible substrate layer being located within the orthographic projection of the second flexible substrate layer on the first flexible substrate layer; and drying the second substrate solution layer to obtain the third flexible substrate layer.

Optionally, upon the forming the second flexible substrate layer on the side of the first inorganic layer distal from the first flexible substrate layer, the method further includes:

sequentially forming a second inorganic layer, a third flexible substrate layer and a third inorganic layer on the side of the second flexible substrate layer distal from the first inorganic layer; an orthographic projection of the third flexible substrate layer on the first flexible substrate layer being located within the orthographic projection of the second flexible substrate layer on the first flexible substrate layer.

In another aspect, a flexible substrate is provided. The flexible substrate includes:

a first flexible substrate layer, a first inorganic layer, and a second flexible substrate layer that are that are sequentially stacked; an orthographic projection of the second flexible substrate layer on the first flexible substrate layer being located within the first flexible substrate layer.

Optionally, the flexible substrate further includes:

a second inorganic layer located on a side of the second flexible substrate layer distal from the first inorganic layer.

Optionally, the flexible substrate further includes:

a third flexible substrate layer located on a side of the second inorganic layer distal from the second flexible substrate layer, an orthographic projection of the third flexible substrate layer on the first flexible substrate layer being located within the orthographic projection of the second flexible substrate layer on the first flexible substrate layer; and a third inorganic layer located on a side of the third flexible substrate layer distal from the second inorganic layer.

In yet another aspect, a method for manufacturing a flexible display substrate is provided. The method includes:

sequentially forming a first flexible substrate layer, a first inorganic layer, and a second flexible substrate layer on a rigid base substrate, an orthographic projection of the second flexible substrate layer on the first flexible substrate layer being located within the first flexible substrate layer;

forming a display structure layer on a side of the second flexible substrate layer distal from the first inorganic layer, an orthographic projection of the display structure layer on the first flexible substrate layer being located within the orthographic projection of the second flexible substrate layer on the first flexible substrate layer; and stripping off the rigid base substrate to obtain the flexible display substrate.

Optionally, prior to the forming the display structure layer on the side of the second flexible substrate layer distal from the first inorganic layer, the method further includes:

forming a second inorganic layer on the side of the second flexible substrate layer distal from the first inorganic layer; and the forming the display structure layer on the side of the second flexible substrate layer distal from the first inorganic layer includes:

forming the display structure layer on a side of the second inorganic layer distal from the second flexible substrate layer.

Optionally, upon the forming the second inorganic layer on the side of the second flexible substrate layer distal from the first inorganic layer, the method further includes:

sequentially forming a third flexible substrate layer and a third inorganic layer on the side of the second inorganic layer distal from the second flexible substrate layer, an orthographic projection of the third flexible substrate layer on the first flexible substrate layer being located within the orthographic projection of the second flexible substrate layer on the first flexible substrate layer; and the forming the display structure layer on the side of the second inorganic layer distal from the second flexible substrate layer includes:

forming the display structure layer on a side of the third inorganic layer distal from the third flexible substrate layer, an orthographic projection of the display structure layer on the first flexible substrate layer being located within the orthographic projection of the third flexible substrate layer on the first flexible substrate layer.

Optionally, prior to the stripping off the rigid base substrate, the method further includes:

forming a encapsulation structure layer on a side of the display structure layer distal from the second flexible substrate layer, the encapsulation structure layer cladding the display structure layer.

Optionally, prior to the forming the display structure layer on the side of the second flexible substrate layer distal from the first inorganic layer, the method further includes:

sequentially forming a second inorganic layer, a third flexible substrate layer and a third inorganic layer on the side of the second flexible substrate layer distal from the first inorganic layer, an orthographic projection of the third flexible substrate layer on the first flexible substrate layer being located within the orthographic projection of the second flexible substrate layer on the first flexible substrate layer;

the forming the display structure layer on the side of the second flexible substrate layer distal from the first inorganic layer includes:

forming the display structure layer on a side of the third inorganic layer distal from the first inorganic layer; and upon the forming the display structure layer on the side of the third inorganic layer distal from the first inorganic layer, the method further includes:

sequentially forming a encapsulation structure layer and a protective layer on the side of the display structure layer distal from the second flexible substrate layer, the encapsulation structure layer cladding the display structure layer.

In another aspect, a flexible display substrate is provided. The flexible display substrate includes:

the flexible substrate of the above another aspect and a display structure layer located on the flexible substrate, wherein the flexible substrate includes a first flexible substrate layer, a first inorganic layer and a second flexible substrate layer that are sequentially stacked, an orthographic projection of the second flexible substrate layer on the first flexible substrate layer being located with the first flexible substrate layer; the display structure layer is located on a side of the second flexible substrate layer distal from the first inorganic layer; and an orthographic projection of the display structure layer on the first flexible substrate layer is located within the orthographic projection of the second flexible substrate layer on the first flexible substrate layer.

Optionally, the flexible substrate further includes:

a second inorganic layer located between the second flexible substrate layer and the display structure layer.

Optionally, the flexible substrate further includes:

a third flexible substrate layer located between the second inorganic layer and the display structure layer, an orthographic projection of the third flexible substrate layer on the first flexible substrate layer being located within the orthographic projection of the second flexible substrate layer on the first flexible substrate layer, and an orthographic projection of the display structure layer on the first flexible substrate layer being located within the orthographic projection of the third flexible substrate layer on the first flexible substrate layer; and a third inorganic layer located between the third flexible substrate layer and the display structure layer.

Optionally, the flexible substrate further includes:

a encapsulation structure layer located on a side of the display structure layer distal from the flexible substrate, the encapsulation structure layer cladding the display structure layer.

Optionally, the flexible substrate further includes:

a second inorganic layer located between the second flexible substrate layer and the display structure layer, a third flexible substrate layer located between the second inorganic layer and the display structure layer, an orthographic projection of the third flexible substrate layer on the first flexible substrate layer being located within the orthographic projection of the second flexible substrate layer on the first flexible substrate layer, and an orthographic projection of the display structure layer on the first flexible substrate layer being located within the orthographic projection of the third flexible substrate layer on the first flexible substrate layer, a third inorganic layer located between the third flexible substrate layer and the display structure layer; and the flexible display substrate further includes:

a encapsulation structure layer located on a side of the display structure layer distal from the flexible substrate, the encapsulation structure layer cladding the display structure layer, and a protective layer located on a side of the encapsulation structure layer distal from the display structure layer.

In another aspect, a display device is provided. The display device includes the flexible display substrate disclosed in the above further aspect.

BRIEF DESCRIPTION OF THE DRAWINGS

For clearer descriptions of the technical solutions in the embodiments of the present disclosure, the following briefly introduces the accompanying drawings required for describing the embodiments. Apparently, the accompanying drawings in the following description show merely some embodiments of the present disclosure, and a person of ordinary skilled in the art may also derive other drawings from these accompanying drawings without creative efforts.

The accompanying drawings, which are incorporated in and constitute a part of this description, illustrate embodiments consistent with the present disclosure and, together with the description, serve to explain the principles of the present disclosure.

DETAILED DESCRIPTION

To make principles, technical solutions and advantages of the present disclosure clearer, the followings describes the present disclosure in detail with reference to the drawings. It is apparent that the described embodiments are only a part of the embodiments of the present disclosure, but not all of them. All other embodiments obtained by those of ordinary skilled in the art based on the embodiments of the present disclosure without any creative effort shall fall within the protection scope of the present disclosure.

Figure 1:
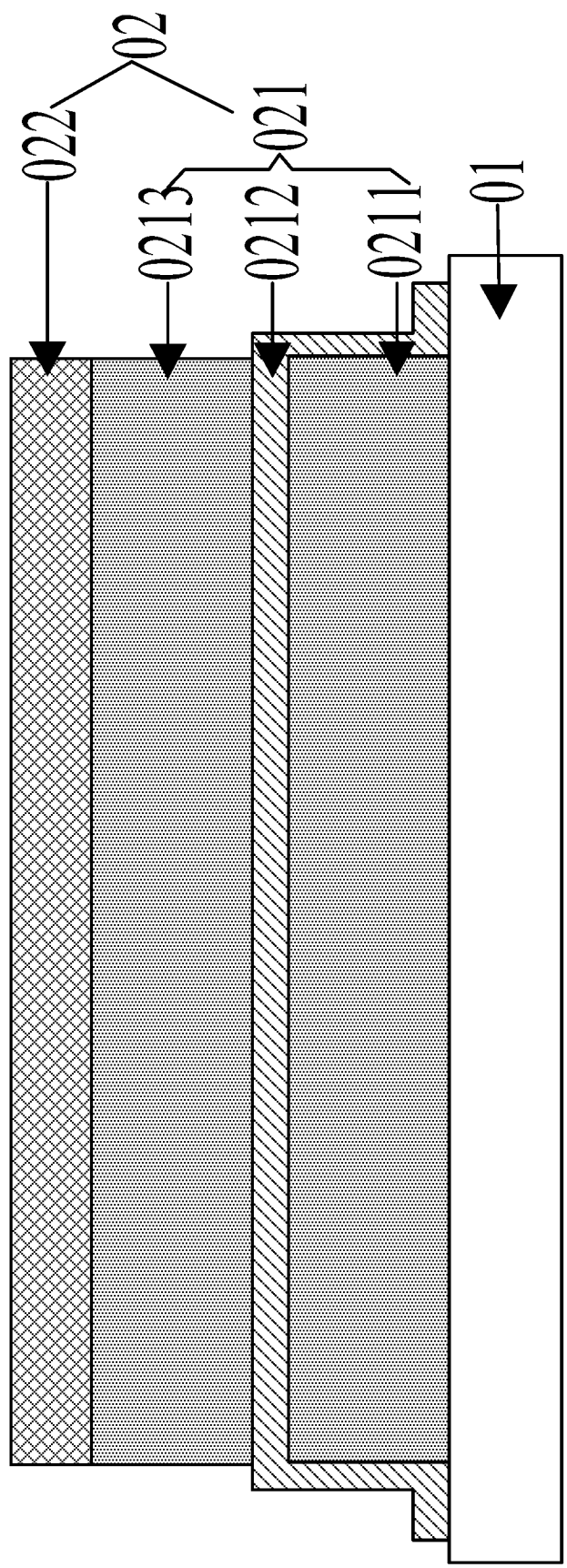
FIG. 1 is a schematic diagram showing an ideal structure of a flexible display substrate known to the inventors.
Figure 2:
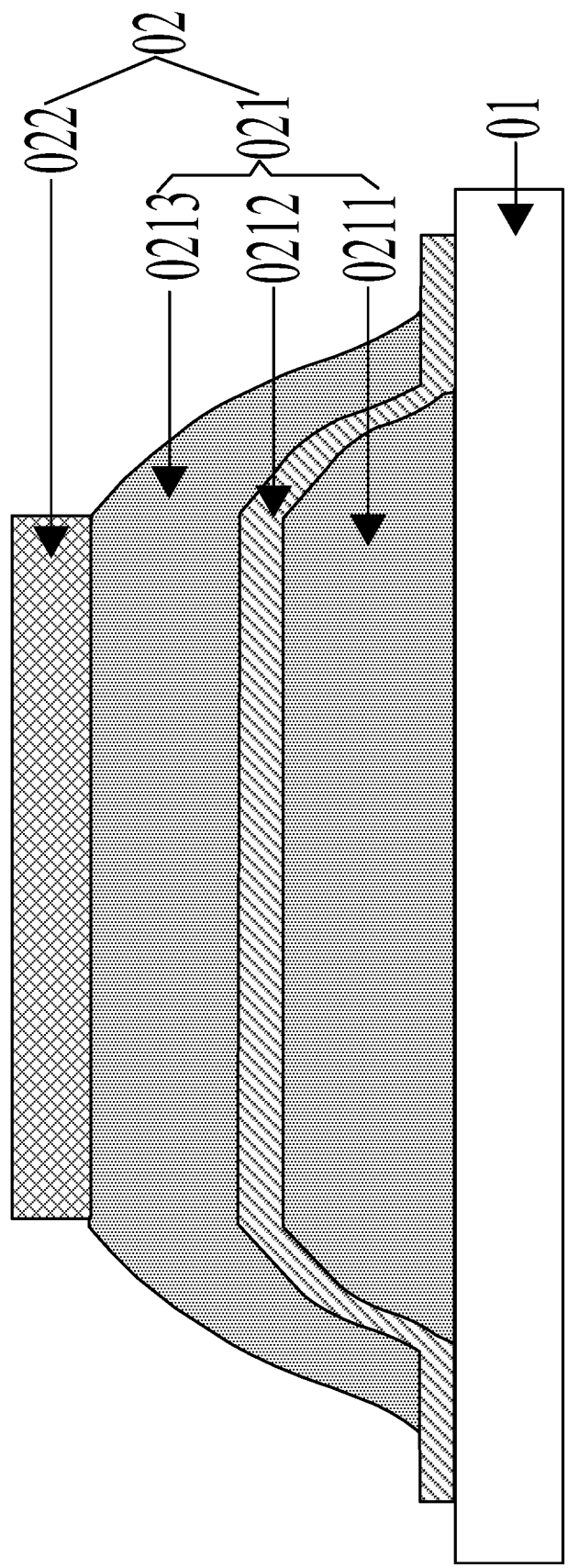
FIG. 2 is a schematic diagram showing an actual structure of the flexible display substrate known to the inventors.

A flexible display substrate includes a flexible substrate and a display structure layer. The flexible substrate includes a first polyimide (PI) layer, an inorganic layer, and a second PI layer that are sequentially stacked. FIG. 1 is a schematic diagram showing an ideal structure of a flexible display substrate known to the inventors. FIG. 2 is a schematic diagram showing an actual structure of the flexible display substrate known to the inventors. As shown in FIG. 1 and FIG. 2, during manufacturing of the flexible display substrate, first, a first PI solution layer is coated on a rigid base substrate 01 and dried to obtain the first PI layer 0211. Then, the inorganic layer 0212 is formed on a side of the first PI layer 0211 distal from the rigid base substrate 01, wherein the inorganic layer 0212 covers the first PI layer 0211, and an edge region of the inorganic layer 0212 (not shown in FIG. 1 and FIG. 2) is bonded to the rigid base substrate 01. Afterwards, a second PI solution layer is coated on a side of the inorganic layer 0212 distal from the first PI layer 0211 and dried to obtain a second PI layer 0213. The first PI layer 0211, the inorganic layer 0212 and the second PI layer 0213 form the flexible substrate 021; and then, the display structure layer 022 is formed on a side of the second PI layer 0213 distal from the inorganic layer 0212. In the end, the rigid base substrate 01 is stripped off to obtain the flexible display substrate 02, wherein the flexible substrate 021 is a base substrate of the flexible display substrate 02.

As shown in FIG. 1, ideally, an orthographic projection of the second PI layer 0213 on the rigid base substrate 01 coincides with an orthographic projection of the first PI layer 0211 on the rigid base substrate 01, and thus, an orthographic projection of the second PI solution layer on the rigid base substrate 01 coincides with the orthographic projection of the first PI layer 0211 on the rigid base substrate 01. However, as shown in FIG. 2, in an actual state, during the coating of the second PI solution layer, the PI solution flows downward to the edge region of the inorganic layer 0212 under the action of gravity, such that an edge region of the finally formed second PI layer 0213 is bonded to the edge region of the inorganic layer 0212. In this way, during a process of stripping of the rigid base substrate 01, only bonding force between the first PI layer 0211 and the rigid base substrate 01 may be removed, but not bonding force between the inorganic layer 0212 and the rigid base substrate 01. Thus, the edge region of the second PI layer 0213 cannot be removed, resulting in damage to the inorganic layer 0212 and the second PI layer 0213 in the finally manufactured flexible display substrate 02, and a process defect such as a wrinkle or bubble in the flexible substrate 021 (as the thickness of the second PI layer 0213 is greater than that of the inorganic layer 0212, the process defect is mainly caused by the damage to the second PI layer 0213). Consequently, the process defect such as the wrinkle or bubble exists in the flexible display substrate 02. When the inorganic layer 0212 and the rigid base substrate 01 are bonded more firmly, the rigid base substrate 01 may not be stripped off.

The main component of the inorganic layer 0212 is silicon, and the main component of the second PI layer 0213 is carbon. After the rigid base substrate 101 is stripped off, a residual substance on the rigid base substrate 01 may be clearly observed by a scanning electron microscope (SEM). By performing energy spectrum analysis on the residual substance, it may be determined that contents of carbon and silicon in the residual substance are higher. Thus, it may be determined that the residual substance on the rigid base substrate 01 includes the inorganic layer 0212 and the second PI layer 0213.

The embodiment of the present disclosure provides a flexible substrate and a manufacturing method of the same, and a flexible display substrate and a manufacturing method of the same, such that a second PI layer is prevented from remaining on a rigid base substrate, thereby avoiding a process defect of the flexible substrate and the flexible display substrate. The solutions of the present disclosure are described in detail with reference to the following embodiments.

Figure 3:
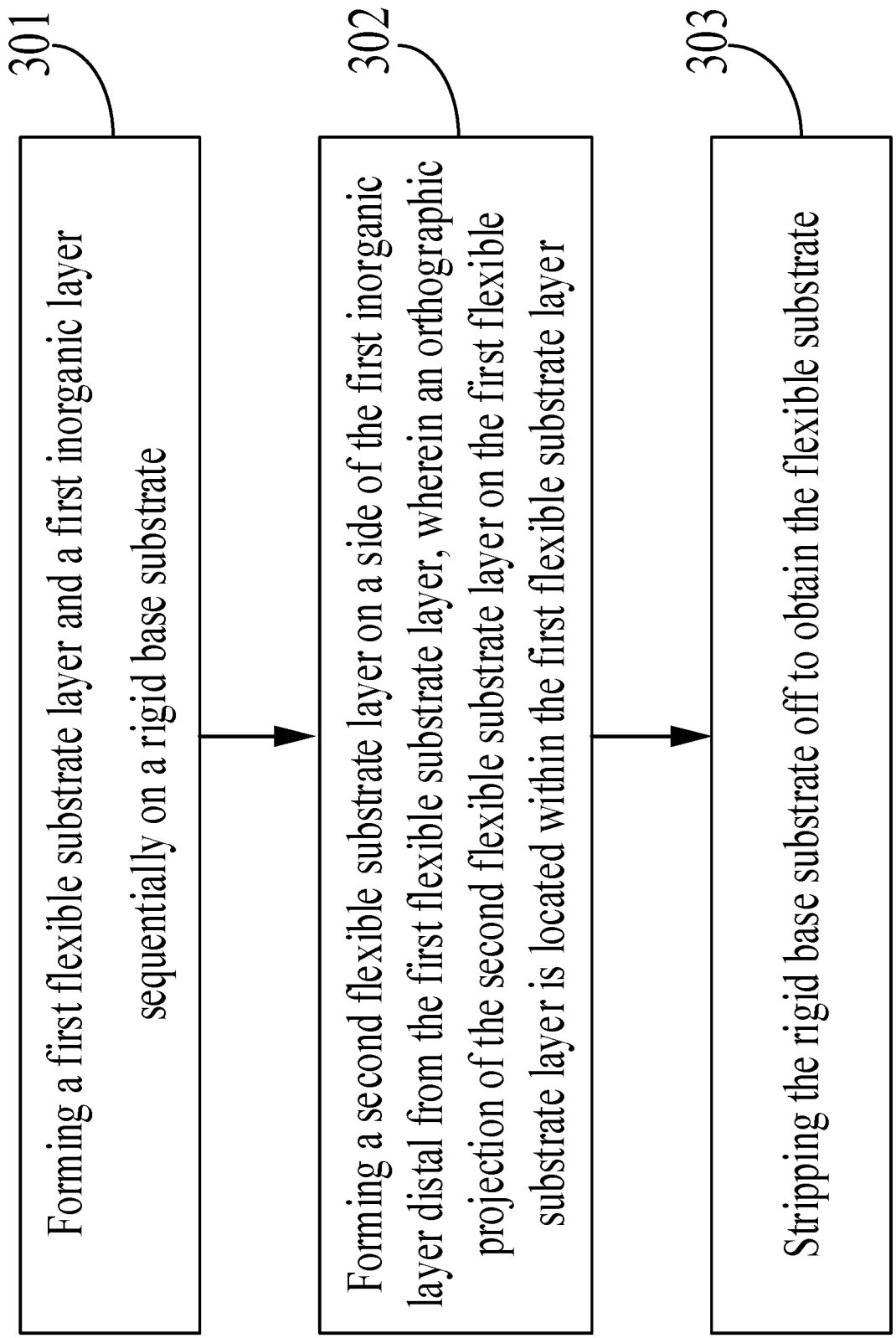
FIG. 3 is a flowchart of a method for manufacturing a flexible substrate according to an embodiment of the present disclosure.

FIG. 3 is a flowchart of a method for manufacturing a flexible substrate according to an embodiment of the present disclosure. Referring to FIG. 3, the method includes the following steps.

In step 301, a first flexible substrate layer and a first inorganic layer are sequentially formed on a rigid base substrate.

In step 302, a second flexible substrate layer is formed on a side of the first inorganic layer distal from the first flexible substrate layer, wherein an orthographic projection of the second flexible substrate layer on the first flexible substrate layer is located within the first flexible substrate layer.

In step 303, the rigid base substrate is stripped off to obtain the flexible substrate.

In summary, in the method for manufacturing the flexible substrate according to the embodiment of the present disclosure, as the first inorganic layer is located on a side of the first flexible substrate layer distal from the rigid base substrate, the second flexible substrate layer is located on the side of the first inorganic layer distal from the first flexible substrate layer, and the orthographic projection of the second flexible substrate layer on the first flexible substrate layer is located within the first flexible substrate layer, during the process of stripping of the rigid base substrate, even if an edge region of the first inorganic layer remains on the rigid base substrate, the second flexible substrate layer does not remain on the rigid base substrate. Thus, a poor process of the flexible substrate is avoided.

Optionally, step 302 includes the following sub-steps.

A first substrate solution layer is formed on the side of the first inorganic layer distal from the first flexible substrate layer, wherein an area of the first substrate solution layer is smaller than an area of the first flexible substrate layer, and an orthographic projection of the first substrate solution layer on the first flexible substrate layer is located within the first flexible substrate layer.

The first substrate solution layer is dried to obtain the second flexible substrate layer.

Optionally, after step 302, the method further includes: forming a second inorganic layer on a side of the second flexible substrate layer distal from the first inorganic layer.

Optionally, after the second inorganic layer is formed on the side of the second flexible substrate layer distal from the first inorganic layer, the method further includes the following sub-steps.

A third flexible substrate layer is formed on a side of the second inorganic layer distal from the second flexible substrate layer, wherein an orthographic projection of the third flexible substrate layer on the first flexible substrate layer is located within the orthographic projection of the second flexible substrate layer on the first flexible substrate layer.

A third inorganic layer is formed on a side of the third flexible substrate layer distal from the second inorganic layer.

Optionally, the forming the third flexible substrate layer on the side of the second inorganic layer distal from the second flexible substrate layer includes the following sub-steps.

A second substrate solution layer is formed on the side of the second inorganic layer distal from the second flexible substrate layer, wherein an area of the second substrate solution layer is smaller than an area of the second flexible substrate layer, and an orthographic projection of the second substrate solution layer on the first flexible substrate layer is located within the orthographic projection of the second flexible substrate layer on the first flexible substrate layer.

The second substrate solution layer is dried to obtain the third flexible substrate layer.

Optionally, all of the first flexible substrate layer, the second flexible substrate layer and the third flexible substrate layer are polyimide layers. A thickness of any one of the first flexible substrate layer, the second flexible substrate layer and the third flexible substrate layer is greater than a thickness of any of the first inorganic layer, the second inorganic layer, and the third inorganic layer.

All of the above optional technical solutions may form other optional embodiments of the present disclosure in an arbitrary combination thereof, and the description thereof is not repeated herein.

Figure 4:
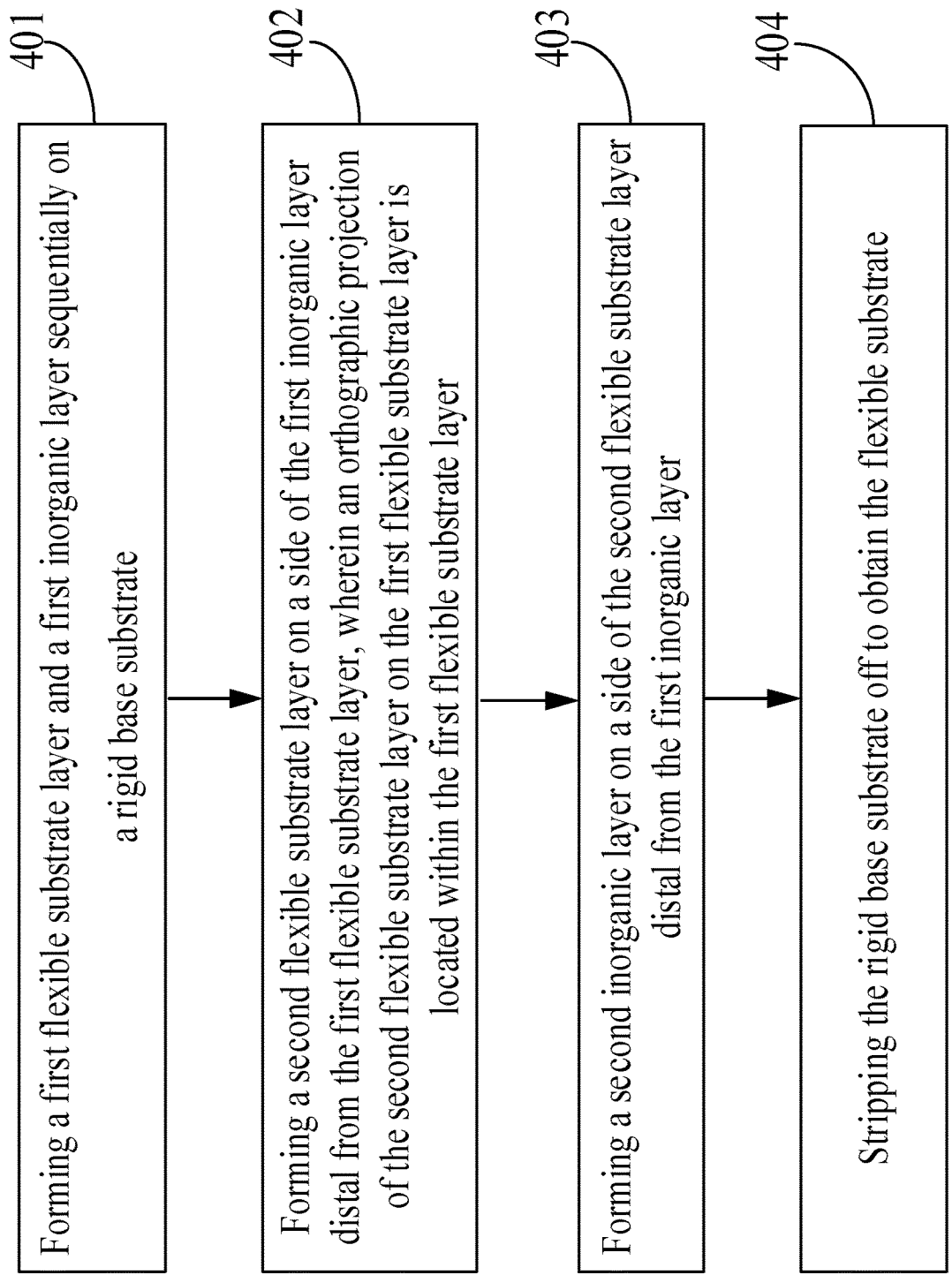
FIG. 4 is a flowchart of a method for manufacturing another flexible substrate according to an embodiment of the present disclosure.

FIG. 4 is a flowchart of a method for manufacturing another flexible substrate according to an embodiment of the present disclosure. Referring to FIG. 4, the method includes the following steps.

In step 401, a first flexible substrate layer and a first inorganic layer are sequentially formed on a rigid base substrate.

Figure 5:
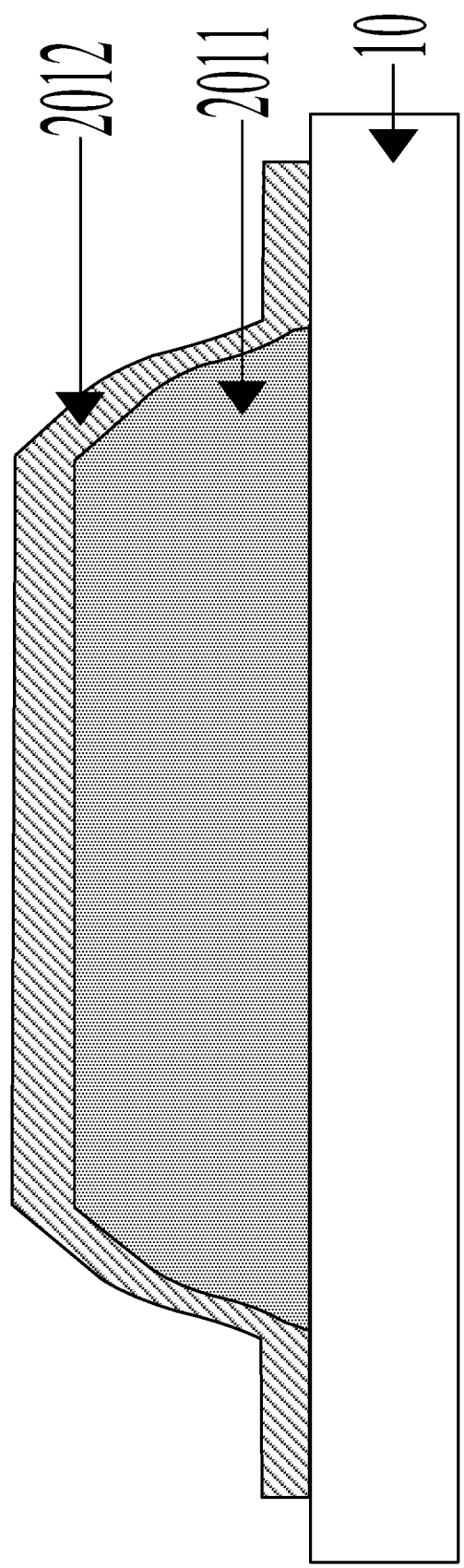
FIG. 5 is a schematic diagram after a first flexible substrate layer and a first inorganic layer are sequentially formed on a rigid base substrate according to an embodiment of the present disclosure.

FIG. 5 is a schematic diagram after the first flexible substrate layer 2011 and the first inorganic layer 2012 are sequentially formed on the rigid base substrate 10 according to an embodiment of the present disclosure. Referring to FIG. 5, the first inorganic layer 2012 covers the first flexible substrate layer 2011; an edge region of the first inorganic layer 2012 (not shown in FIG. 5) is bonded to the rigid base substrate 10; and a thickness of the first flexible substrate layer 2011 is greater than a thickness of the first inorganic layer 2012.

The rigid base substrate 10 may be a substrate made of a material having a specific rigidity such as glass, quartz or transparent resin. The first flexible substrate layer 2011 may be a PI layer. The first inorganic layer 2012 may be made of an inorganic material such as $SiO_x$ (silicon oxide), $SiN_x$ (silicon nitride), $Al_2O_3$ (alumina) or $SiO_xN_x$ (silicon oxynitride).

Optionally, the sequentially forming the first flexible substrate layer 2011 and the first inorganic layer 2012 on the rigid base substrate 10 may include: coating a layer of PI solution on the rigid base substrate 10, and drying the PI solution; removing a solvent of the PI solution to retain a solute of the PI solution so as to form the first flexible substrate layer 2011; and forming, using $SiO_x$ as a material, the first inorganic layer 2012 on the side of the first flexible substrate layer 2011 distal from the rigid base substrate 10 by any one of coating, magnetron sputtering, thermal evaporation or plasma enhanced chemical vapor deposition (PECVD).

In step 402, a second flexible substrate layer is formed on a side of the first inorganic layer distal from the first flexible substrate layer, wherein an orthographic projection of the second flexible substrate layer on the first flexible substrate layer is located within the first flexible substrate layer.

Figure 6:
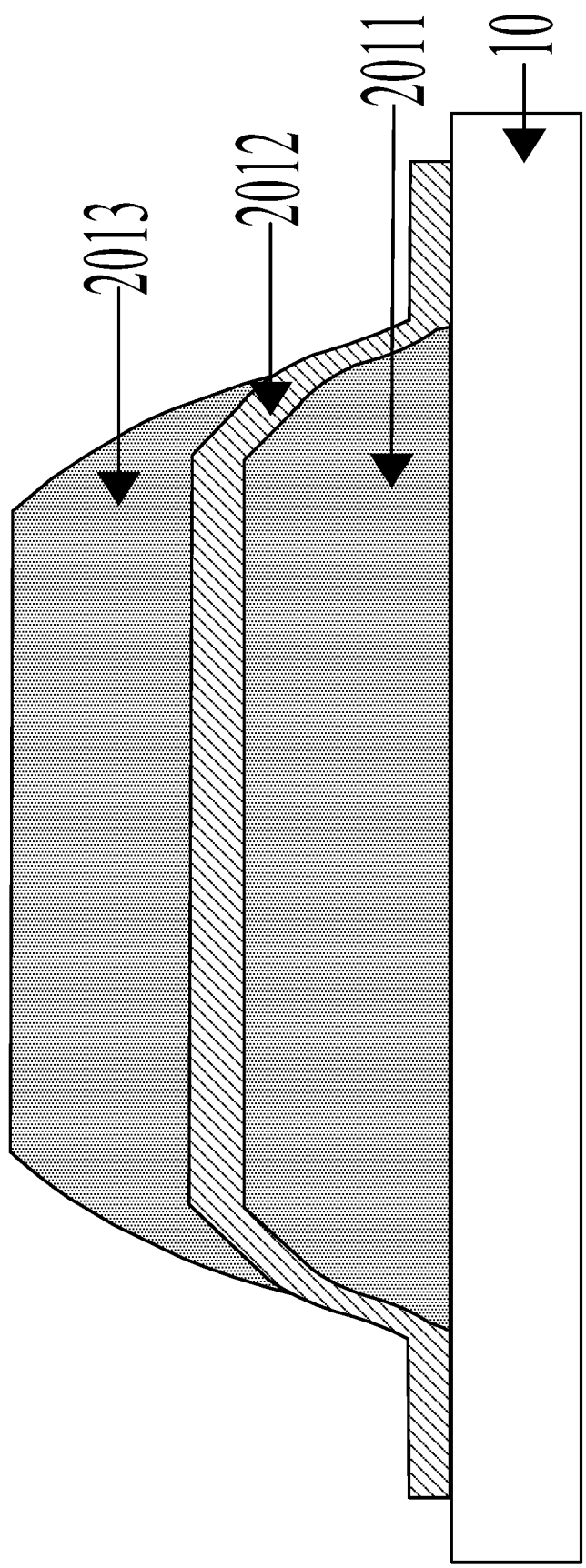
FIG. 6 is a schematic diagram after a second flexible substrate layer is formed on a side of the first inorganic layer distal from the first flexible substrate layer according to an embodiment of the present disclosure.

FIG. 6 is a schematic diagram after a second flexible substrate layer 2013 is formed on a side of the first inorganic layer 2012 distal from the first flexible substrate layer 2011 according to an embodiment of the present disclosure. Referring to FIG. 6, the orthographic projection of the second flexible substrate layer 2013 on the first flexible substrate layer 2011 is located within the first flexible substrate layer 2011, and the thickness of the second flexible substrate layer 2013 is greater than the thickness of the first inorganic layer 2012.

Optionally, step 402 may include: forming a first substrate solution layer on the side of the first inorganic layer 2012 distal from the first flexible substrate layer 2011, wherein an area of the first substrate solution layer is smaller than that of the first flexible substrate layer 2011, and an orthographic projection of the first substrate solution layer on the first flexible substrate layer 2011 is located within the first flexible substrate layer 2011; and drying the first substrate solution layer to obtain the second flexible substrate layer 2013. As the area of the first substrate solution layer is smaller than that of the first flexible substrate layer 2011, and the orthographic projection of the first substrate solution layer on the first flexible substrate layer 2011 is located within the first flexible substrate layer 2011, an orthographic projection of the second flexible substrate layer 2013 on the first flexible substrate layer 2011 is located within the first flexible substrate layer 2011.

The first substrate solution layer may be a PI solution layer, and may be formed by using a PI coater to coat a layer of PI solution on the side of the first inorganic layer 2012 distal from the first flexible substrate layer 2011. The first substrate solution layer may be dried by a drying process to remove the solvent of the first substrate solution layer to retain the solute of the first substrate solution layer so as to form the second flexible substrate layer 2013. The drying process may be, for example, a high-pressure drying process or an air-cooling drying process, which is not limited in the embodiments of the present disclosure.

In step 403, a second inorganic layer is formed on a side of the second flexible substrate layer distal from the first inorganic layer.

Figure 7:
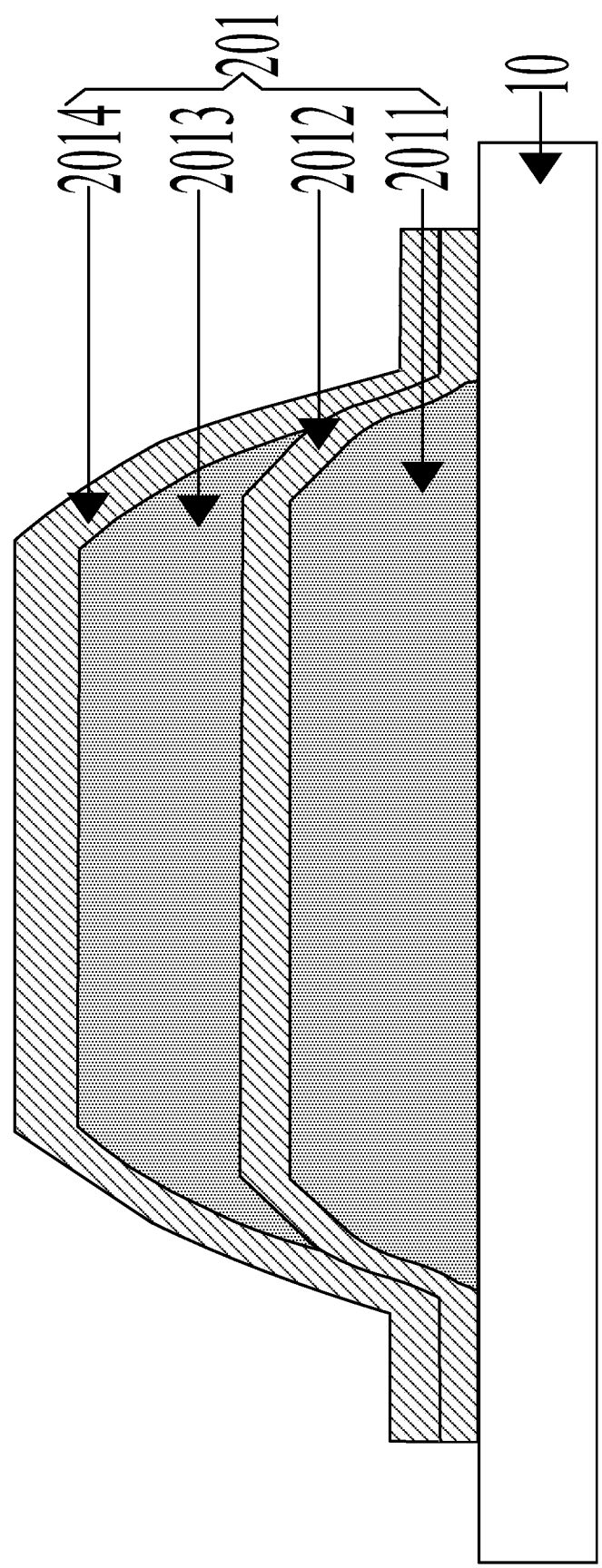
FIG. 7 is a schematic diagram after a second inorganic layer is formed on a side of a second flexible substrate layer distal from the first inorganic layer according to an embodiment of the present disclosure.

FIG. 7 is a schematic diagram after the second inorganic layer 2014 is formed on the side of a second flexible substrate layer 2013 distal from the first inorganic layer 2012 according to an embodiment of the present disclosure. Referring to FIG. 7, an orthographic projection of the second inorganic layer 2014 on the rigid base substrate 10 coincides with the orthographic projection of the first inorganic layer 2012 on the rigid base substrate 10. Both the thickness of the first flexible substrate layer 2011 and the thickness of the second flexible substrate layer 2013 are greater than the thickness of the second inorganic layer 2014. After the second inorganic layer 2014 is formed, the first flexible substrate layer 2011, the first inorganic layer 2012, the second flexible substrate layer 2013 and the second inorganic layer 2014 form the flexible substrate 201.

The second inorganic layer 2014 may be made of an inorganic material such as $SiO_x$, $SiN_x$, $Al_2O_3$ or $SiO_xN_x$. The material of the second inorganic layer 2014 may be the same as or different from the material of the first inorganic layer 2012. A forming process of the second inorganic layer 2014 may be referenced to a forming process of the first inorganic layer 2012 in step 401, which is not repeated in the embodiment of the present disclosure herein.

Figure 8:
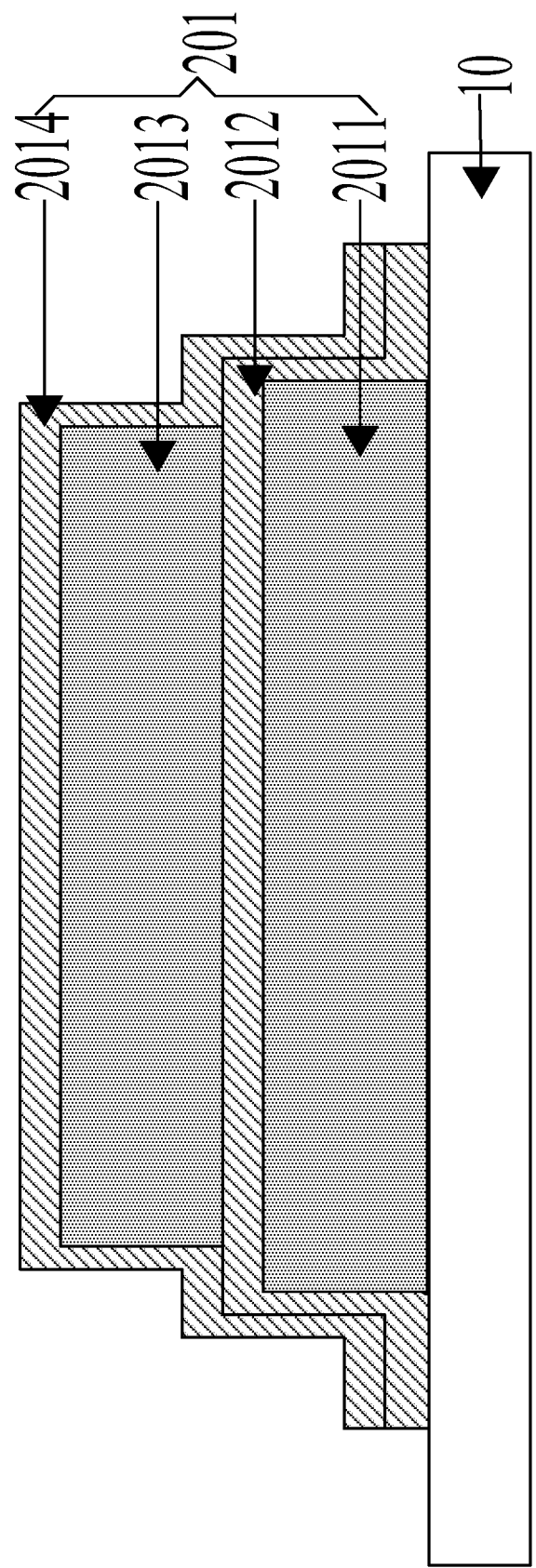
FIG. 8 is a schematic diagram showing an ideal structure of a flexible substrate according to an embodiment of the present disclosure.

It is readily understood by those skilled in the art that FIG. 5 to FIG. 7 show the schematic diagram of the flexible substrate in an actual manufacturing process. Ideally, the flexible substrate obtained by steps 401 to 403 may be as shown in FIG. 8. The area of the second flexible substrate layer 2013 is smaller than that of the first flexible substrate layer 2011, and the orthographic projection of the second flexible substrate layer 2013 on the first flexible substrate layer 2011 is located within the first flexible substrate layer 2011. Nevertheless, ideally, the orthographic projection of the second flexible substrate layer 2013 on the first flexible substrate layer 2011 may also coincide with the first flexible substrate layer 2011, which is not limited in the embodiments of the present disclosure.

In step 404, the rigid base substrate is stripped off to obtain the flexible substrate.

Figure 9:
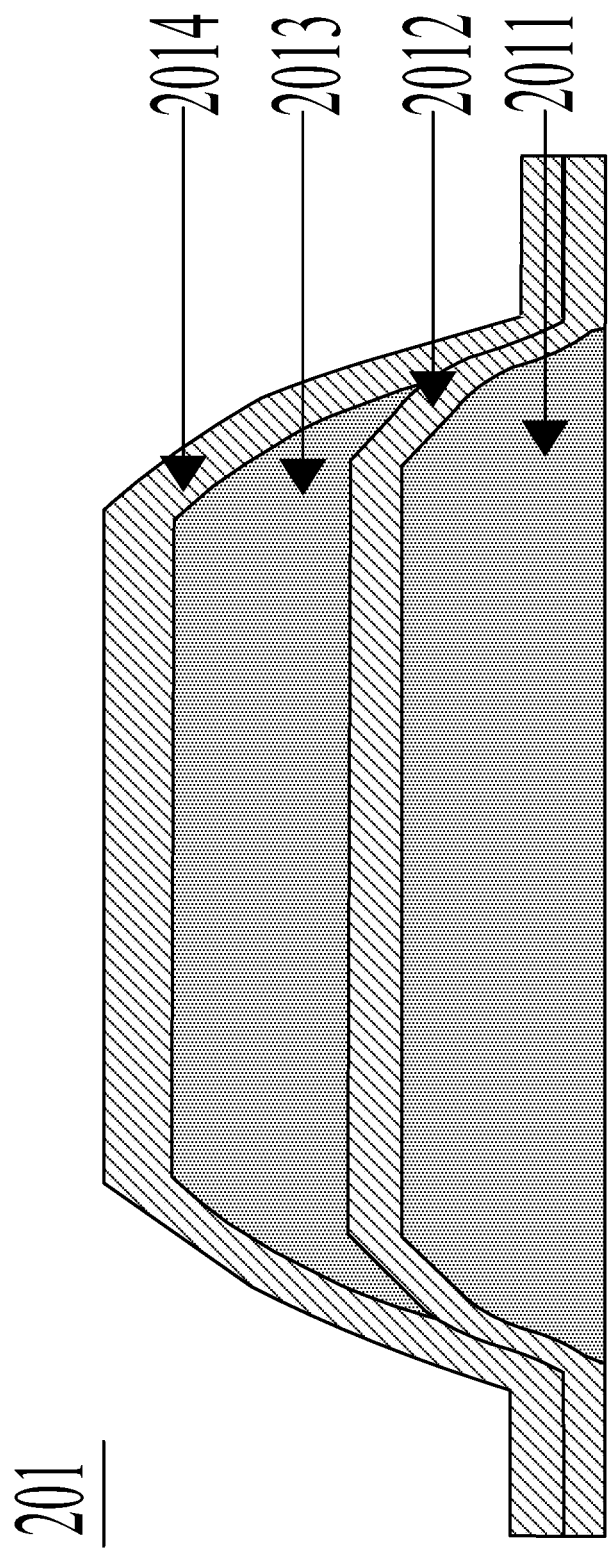
FIG. 9 is a schematic diagram showing an actual structure of the flexible substrate according to an embodiment of the present disclosure.

The flexible substrate may be obtained after the rigid base substrate 10 is stripped off. FIG. 9 shows a schematic structural diagram of a flexible substrate 201 according to an embodiment of the present disclosure. Referring to FIG. 9, the flexible substrate 201 includes a first flexible substrate layer 2011, a first inorganic layer 2012, a second flexible substrate layer 2013, and the second inorganic layer 2014 that are sequentially stacked. An orthographic projection of the second flexible substrate layer 2013 on the first flexible substrate layer 2011 is located within the first flexible substrate layer 2011, and orthographic projections of the first inorganic layer 2012 and the second inorganic layer 2014 on the plane of the first flexible substrate layer 2011 coincide with each other.

Figure 10:
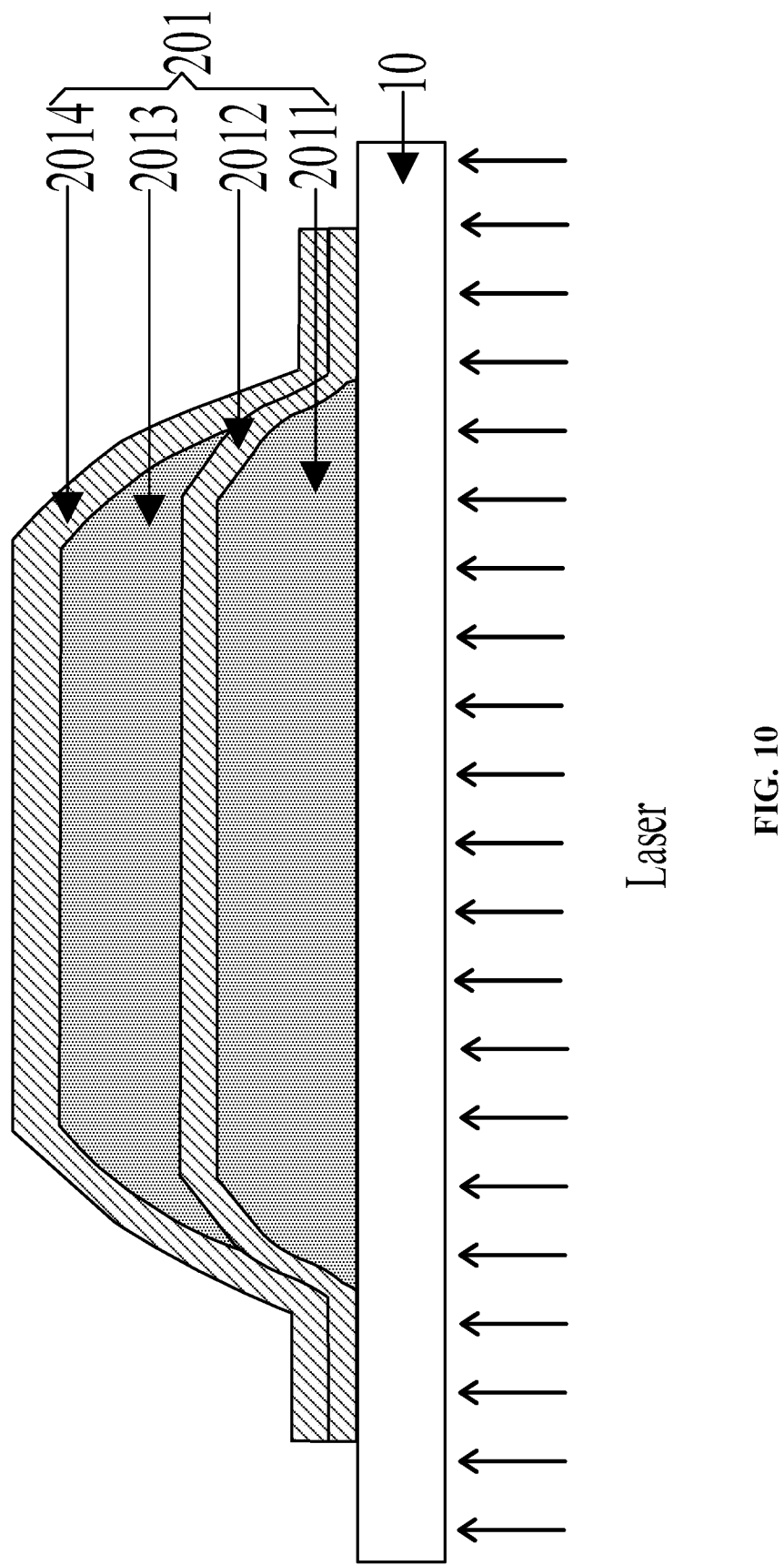
FIG. 10 is a schematic diagram of removing bonding force between a first flexible substrate layer and a rigid base substrate by an LLO process according to an embodiment of the present disclosure.

Optionally, stripping off the rigid base substrate 10 may include removing the bonding force between the first flexible substrate layer 2011 and the rigid base substrate 10 by a laser lift-off (LLO) process. FIG. 10 is a schematic diagram of removing a bonding force between the first flexible substrate layer 2011 and the rigid base substrate 10 by the LLO process according to an embodiment of the present disclosure. Referring to FIG. 10, laser may be adopted to illuminate the rigid base substrate 10 from the side of the rigid base substrate 10 distal from the first flexible substrate layer 2011; and under the action of the laser, the bonding force between the first flexible substrate layer 2011 and the rigid base substrate 10 is removed, wherein the wavelength of the laser may be 308 nm (nanometer).

It is readily understood by those skilled in the art that as an area of a bonding surface of the first inorganic layer 2012 and the rigid base substrate 10 is smaller than an area of a bonding surface of the first flexible substrate layer 2011 and the rigid base substrate 10, after the bonding force between the first flexible substrate layer 2011 and the rigid base substrate 10 is removed, it may be considered that the rigid base substrate 10 is separated from the flexible substrate 201. In the embodiment of the present disclosure, as the orthographic projection of the second flexible substrate layer 2013 on the first flexible substrate layer 2011 is located within the first flexible substrate layer 2011, after the first flexible substrate layer 2011 is separated from the rigid base substrate 10, the second flexible substrate layer 2013 is also separated from the rigid base substrate 10. The second flexible substrate layer 2013 does not remain on the rigid base substrate 10, such that no damage is brought to the second flexible substrate layer 2013 in the flexible substrate 201, and the flexible substrate 201 is free from a process defect such as a wrinkle or bubble.

In summary, in the method for manufacturing the flexible substrate according to the embodiment of the present disclosure, as the first inorganic layer is located on the side of the first flexible substrate layer distal from the rigid base substrate, the second flexible substrate layer is located on the side of the first inorganic layer distal from the first flexible substrate layer, and the orthographic projection of the second flexible substrate layer on the first flexible substrate layer is located within the first flexible substrate layer, during the process of stripping of the rigid base substrate, even if an edge region of the first inorganic layer remains on the rigid base substrate, the second flexible substrate layer does not remain on the rigid base substrate. Thus, a poor process of the flexible substrate is avoided.

Figure 11:
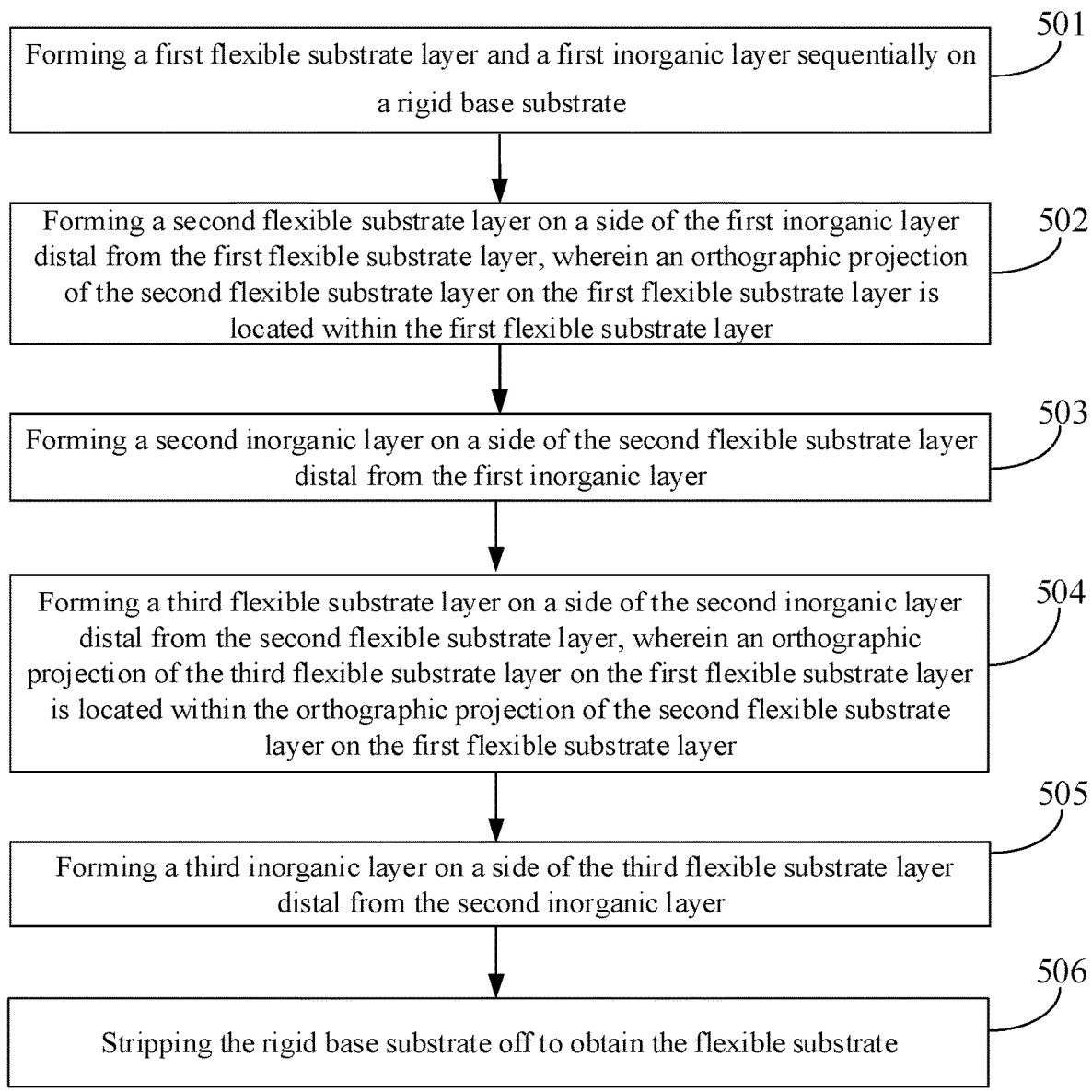
FIG. 11 is a flowchart of a method for manufacturing yet another flexible substrate according to an embodiment of the present disclosure.

FIG. 11 is a flowchart of a method for manufacturing yet another flexible substrate according to an embodiment of the present disclosure. Referring to FIG. 11, the method includes the following steps.

In step 501, a first flexible substrate layer and a first inorganic layer are sequentially formed on a rigid base substrate.

In step 502, a second flexible substrate layer is formed on a side of the first inorganic layer distal from the first flexible substrate layer, wherein an orthographic projection of the second flexible substrate layer on the first flexible substrate layer is located within the first flexible substrate layer.

In step 503, a second inorganic layer is formed on a side of the second flexible substrate layer distal from the first inorganic layer.

An implementation process of steps 501 to 503 may be referenced to that of steps 401 to 403 in the embodiment shown in FIG. 4, and related drawings may be referenced to FIG. 5 to FIG. 7, which are not repeated in the embodiment of the present disclosure herein.

In step 504, a third flexible substrate layer is formed on a side of the second inorganic layer distal from the second flexible substrate layer, wherein an orthographic projection of the third flexible substrate layer on the first flexible substrate layer is located within the orthographic projection of the second flexible substrate layer on the first flexible substrate layer.

Figure 12:
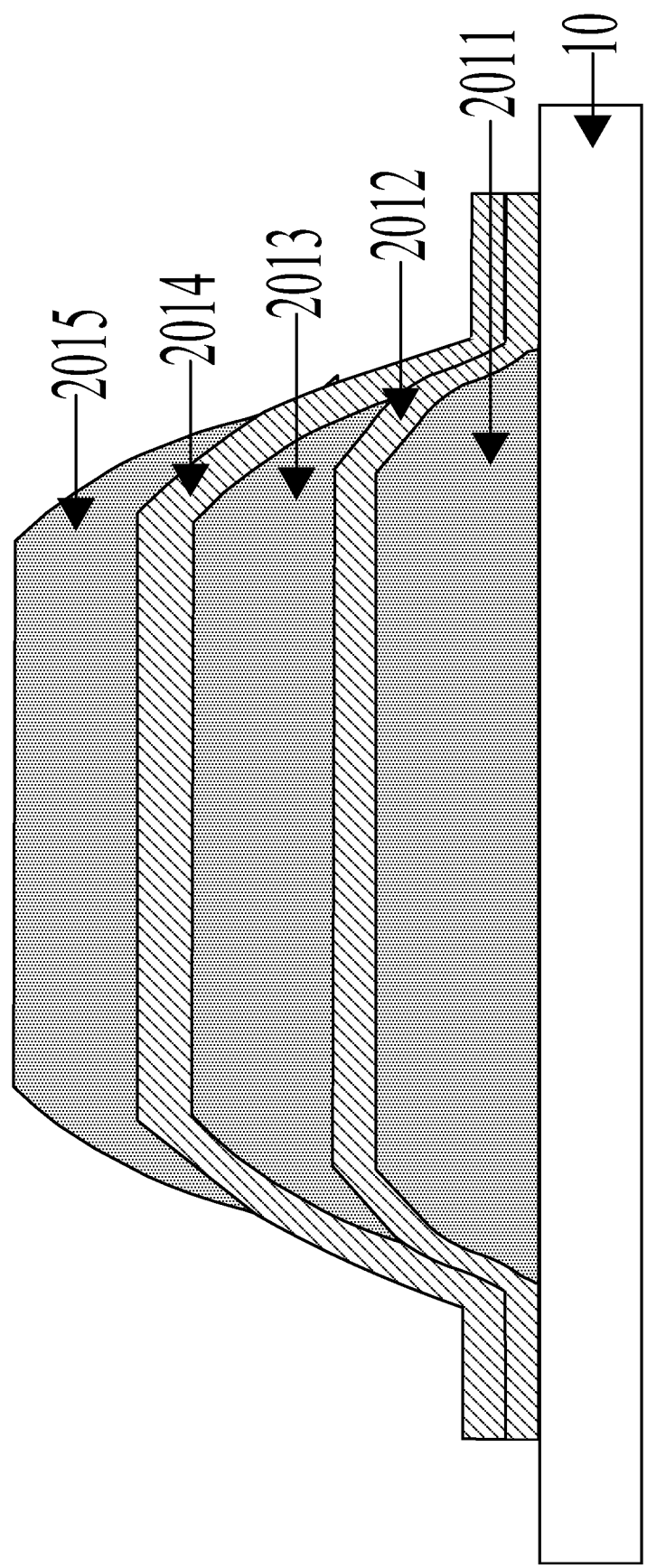
FIG. 12 is a schematic diagram of forming a third flexible substrate layer on a side of the second inorganic layer distal from the second flexible substrate layer according to an embodiment of the present disclosure.

FIG. 12 is a schematic diagram after the third flexible substrate layer 2015 is formed on the side of the second inorganic layer 2014 distal from the second flexible substrate layer 2013 according to an embodiment of the present disclosure. An orthographic projection of the third flexible substrate layer 2015 on the first flexible substrate layer 2011 is located within the orthographic projection of the second flexible substrate layer 2013 on the first flexible substrate layer 2011. The thickness of the third flexible substrate layer 2015 is greater than the thickness of the first inorganic layer 2012 and the thickness of the second inorganic layer 2014.

Optionally, step 504 may include: forming a second substrate solution layer on the side of the second inorganic layer 2014 distal from the second flexible substrate layer 2013, wherein an area of the second substrate solution layer is smaller than that of the second flexible substrate layer 2013, and an orthographic projection of the second substrate solution layer on the first flexible substrate layer 2011 is located within the orthographic projection of the second flexible substrate layer 2013 on the first flexible substrate layer 2011; and drying the second substrate solution layer to obtain the third flexible substrate layer 2015. As the area of the second substrate solution layer is smaller than that of the second flexible substrate layer 2013, and the orthographic projection of the second substrate solution layer on the first flexible substrate layer 2011 is located within the orthographic projection of the second flexible substrate layer 2013 on the first flexible substrate layer 2011, an orthographic projection of the third flexible substrate layer 2015 on the first flexible substrate layer 2011 is located within the orthographic projection of the second flexible substrate layer 2013 on the first flexible substrate layer 2011.

The second substrate solution layer may be a PI solution layer, and may be formed by using a PI coater to coat a layer of PI solution on the side of the second inorganic layer 2014 distal from the second flexible substrate layer 2013. The second substrate solution layer may be dried by a drying process to remove the solvent of the second substrate solution layer to retain the solute of the second substrate solution layer so as to form the third flexible substrate layer 2015. The drying process may be, for example, a high-pressure drying process or an air-cooling drying process, which is not limited in the embodiments of the present disclosure.

In step 505, a third inorganic layer is formed on a side of the third flexible substrate layer distal from the second inorganic layer.

Figure 13:
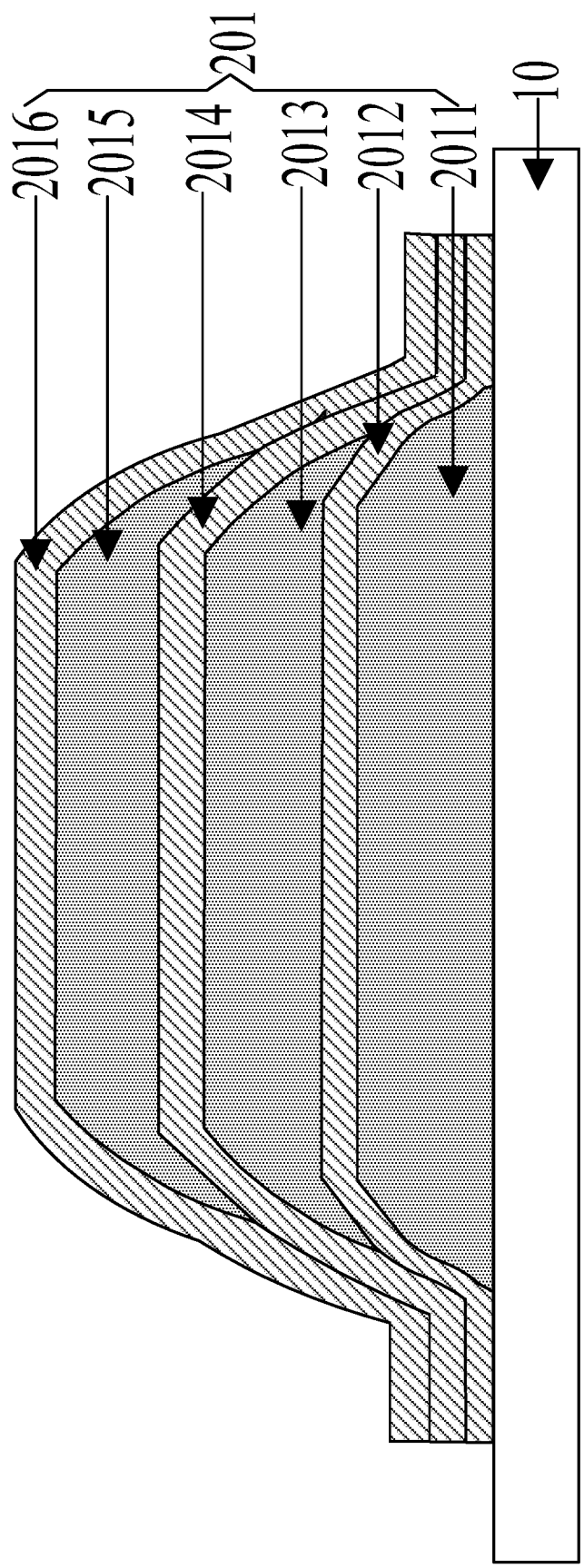
FIG. 13 is a schematic diagram after a third inorganic layer is formed on a side of the third flexible substrate layer distal from the second inorganic layer according to an embodiment of the present disclosure.

FIG. 13 is a schematic diagram after the third inorganic layer 2016 is formed on the side of the third flexible substrate layer 2015 distal from the second inorganic layer 2014 according to an embodiment of the present disclosure. Orthographic projections of the third inorganic layer 2016, the second inorganic layer 2014 and the first inorganic layer 2012 on the rigid base substrate 10 coincide with one another. The thickness of any of the first flexible substrate layer 2011, the second flexible substrate layer 2013 and the third flexible substrate layer 2015 is greater than the thickness of the third inorganic layer 2016. As shown in FIG. 13, after the third inorganic layer 2016 is formed, the first flexible substrate layer 2011, the first inorganic layer 2012, the second flexible substrate layer 2013, the second inorganic layer 2014, the third flexible substrate layer 2015 and the third inorganic layer 2016 form the flexible substrate 201.

The third inorganic layer 2016 may be made of an inorganic material such as $SiO_x$, $SiN_x$, $Al_2O_3$ or $SiO_xN_x$. The materials of the third inorganic layer 2016, the second inorganic layer 2016 and the first inorganic layer 2012 may be the same or different. A forming process of the third inorganic layer 2016 may be referenced to a forming process of the first inorganic layer 2012 in step 401, which is not repeated by the embodiment of the present disclosure herein.

Figure 14:
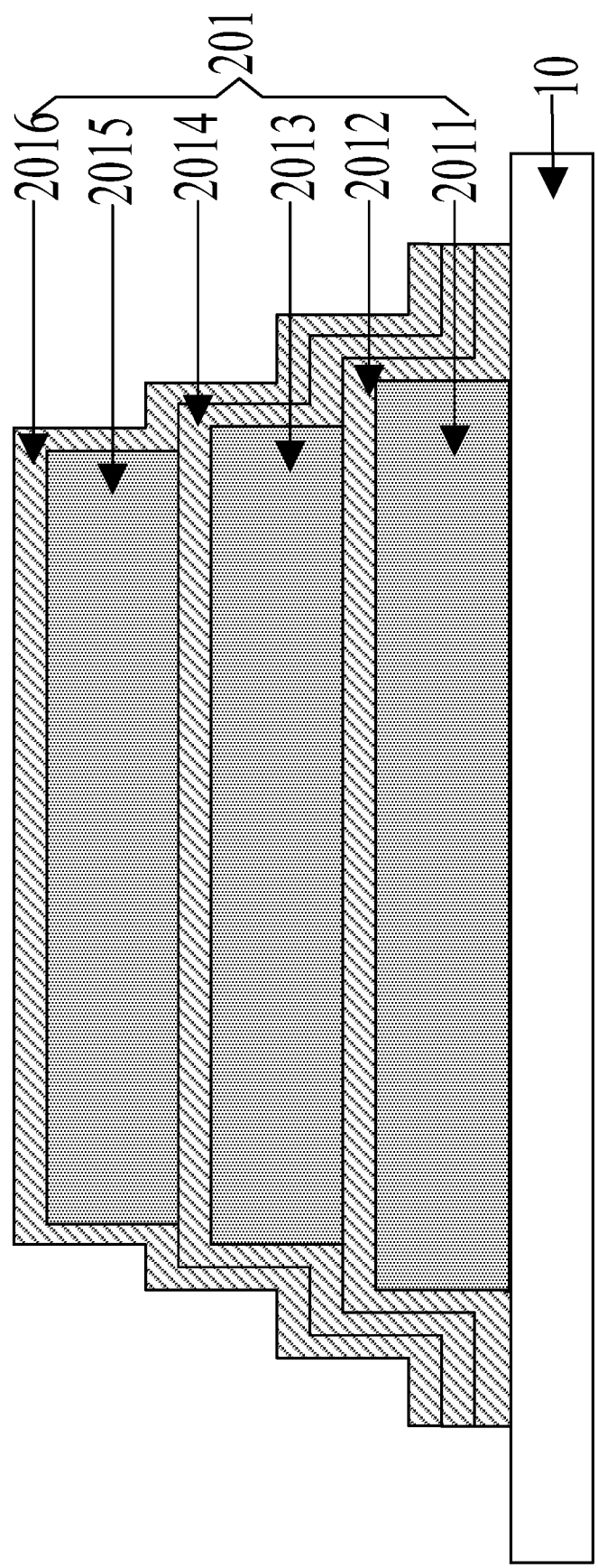
FIG. 14 is a schematic diagram showing an ideal structure of another flexible substrate according to an embodiment of the present disclosure.

It is readily understood by those skilled in the art that FIG. 5 to FIG. 7 and FIG. 12 and FIG. 13 show the schematic diagram of the flexible substrate in an actual manufacturing process. Ideally, the flexible substrate obtained by steps 501 to 505 may be as shown in FIG. 14. The area of the second flexible substrate layer 2013 is smaller than that of the first flexible substrate layer 2011, and the orthographic projection of the second flexible substrate layer 2013 on the first flexible substrate layer 2011 is located within the first flexible substrate layer 2011. The area of the third flexible substrate layer 2015 is smaller than the area of the second flexible substrate layer 2013, and the orthographic projection of the third flexible substrate layer 2015 on the first flexible substrate layer 2011 is located within the orthographic projection of the second flexible substrate layer 2013 on the first flexible substrate layer 2011. Nevertheless, ideally, both the orthographic projection of the third flexible substrate layer 2015 on the first flexible substrate layer 2011 and the orthographic projection of the second flexible substrate layer 2015 on the first flexible substrate layer 2011 may coincide with the first flexible substrate layer 2013, which is not limited in the embodiments of the present disclosure herein.

In step 506, the rigid base substrate is stripped off to obtain the flexible substrate.

Figure 15:
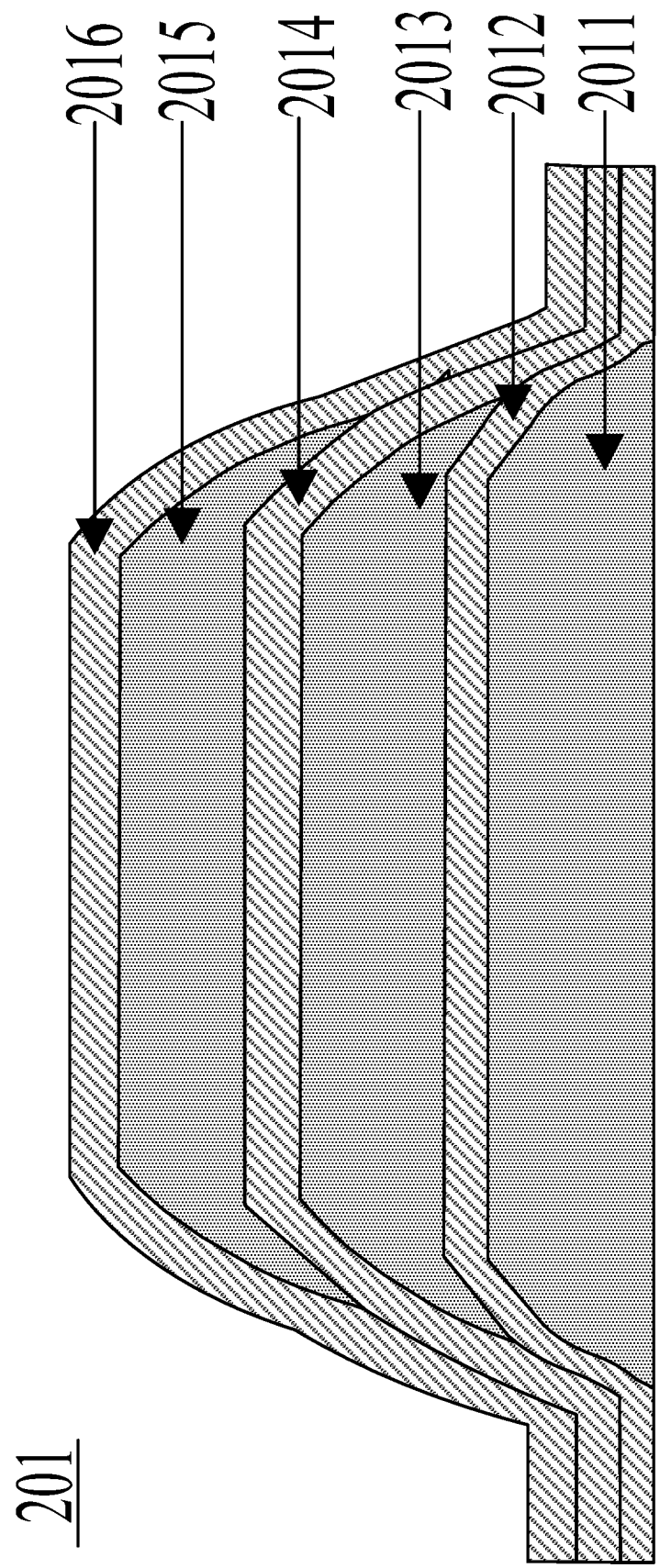
FIG. 15 is a schematic diagram showing an actual structure of the another flexible substrate according to an embodiment of the present disclosure.

The flexible substrate is obtained after the rigid base substrate is stripped off. FIG. 15 shows a schematic structure diagram of another flexible substrate 201 according to an embodiment of the present disclosure. The flexible substrate 201 includes a first flexible substrate layer 2011, a first inorganic layer 2012, a second flexible substrate layer 2013, a second inorganic layer 2014, a third flexible substrate layer 2015, and a third second inorganic layer 2016 that are sequentially stacked. An orthographic projection of the second flexible substrate layer 2013 on the first flexible substrate layer 2011 is located within the first flexible substrate layer 2011; an orthographic projection of the third flexible substrate layer 2015 on the first flexible substrate layer 2011 is located within the orthographic projection of the second flexible substrate layer 2013 on the first flexible substrate layer 2011; and the orthographic projections of the first inorganic layer 2012, the second inorganic layer 2014 and the third inorganic layer 2016 on the plane of the first flexible substrate layer 2011 coincide with one another. An implementation process of step 506 may be referenced to that of step 404 in the embodiment shown in FIG. 4, which is not repeated in the embodiment of the present disclosure herein.

In summary, in the method for manufacturing the flexible substrate according to the embodiment of the present disclosure, as the first inorganic layer is located on the side of the first flexible substrate layer distal from the rigid base substrate, the second flexible substrate layer is located on the side of the first inorganic layer distal from the first flexible substrate layer, and the orthographic projection of the second flexible substrate layer on the first flexible substrate layer is located within the first flexible substrate layer, during the process of stripping of the rigid base substrate, even if an edge region of the first inorganic layer remains on the rigid base substrate, the second flexible substrate layer does not remain on the rigid base substrate. Thus, a poor process of the flexible substrate is avoided.

Based on the same inventive concept, the embodiment of the present disclosure provide a flexible substrate which may be the flexible substrate 201 as shown in FIG. 9 or FIG. 15, Referring to FIG. 9 and FIG. 15, the flexible substrate 201 includes a first flexible substrate layer 2011, a first inorganic layer 2012 and a second flexible substrate layer 2013 that are sequentially stacked, wherein an orthographic projection of the second flexible substrate layer 2013 on the first flexible substrate layer 2011 is located within the first flexible substrate layer 2011, and the first inorganic layer 2012 covers the first flexible substrate layer 2011.

Optionally, as shown in FIG. 9 and FIG. 15, the flexible substrate 201 further includes a second inorganic layer 2014 located on a side of the second flexible substrate layer 2013 distal from the first inorganic layer 2012. An orthographic projection of the second inorganic layer 2014 on the plane of the first flexible substrate layer 2011 coincides with the orthographic projection of the first inorganic layer 2012 on the plane of the first flexible substrate layer 2011.

Optionally, as shown in FIG. 15, the flexible substrate 201 further includes a third flexible substrate layer 2015 located on a side of the second inorganic layer 2014 distal from the second flexible substrate layer 2013. An orthographic projection of the third flexible substrate layer 2015 on the first flexible substrate layer 2011 is located within the orthographic projection of the second flexible substrate layer 2013 on the first flexible substrate layer 2011. The flexible substrate 201 further includes a third inorganic layer 2016 located on a side of the third flexible substrate layer 2015 distal from the second inorganic layer 2014. The orthographic projections of the third inorganic layer 2016, the second inorganic layer 2014 and the first inorganic layer 2012 on the plane of the first flexible substrate layer 2011 coincide with one another.

Optionally, in the embodiment of the present disclosure, all of the first flexible substrate layer 2011, the second flexible substrate layer 2013 and the third flexible substrate layer 2015 are PI layers. A thickness of any one of the first flexible substrate layer 2011, the second flexible substrate layer 2013 and the third flexible substrate layer 2015 is greater than a thickness of any of the first inorganic layer 2012, the second inorganic layer 2014 and the third inorganic layer 2016. For example, the thickness of the first flexible substrate layer 2011 is greater than the thickness of any of the first inorganic layer 2012, the second inorganic layer 2014 and the third inorganic layer 2016. For another example, the thickness of the second flexible substrate layer 2013 is greater than the thickness of any of the first inorganic layer 2012, the second inorganic layer 2014 and the third inorganic layer 2016. It is readily understood that as the texture of the flexible substrate layer is relatively flexible, and the texture of the inorganic layer is relatively hard, the flexible substrate may maintain good flexibility by setting the thickness of the flexible substrate layer to be greater than that of the inorganic layer.

It is readily understood by those skilled in the art that the structure of the flexible substrate 201 according to the embodiment of the present disclosure is merely exemplary. In actual applications, the flexible substrate may include a plurality of flexible substrate layers and a plurality of inorganic layers which are alternately stacked, wherein areas of the flexible substrate layers are sequentially reduced along the direction in which the flexible substrate layers and the inorganic layers are stacked, which is not limited in the embodiments of the present disclosure. In addition, the embodiments of the flexible substrate and the method for manufacturing the same according to the present disclosure may be referenced to each other. Details not disclosed in the embodiment of the flexible substrate may be referenced to the embodiment of the method for manufacturing the flexible substrate, which are not repeated herein.

In summary, in the flexible substrate according to the embodiment of the present disclosure, as the first inorganic layer is located on the side of the first flexible substrate layer distal from the rigid base substrate, the second flexible substrate layer is located on the side of the first inorganic layer distal from the first flexible substrate layer, and the orthographic projection of the second flexible substrate layer on the first flexible substrate layer is located within the first flexible substrate layer, during the process of manufacturing the flexible substrate, even if an edge region of the first inorganic layer remains on the rigid base substrate, the second flexible substrate layer does not remain on the rigid base substrate. Thus, a poor process of the flexible substrate is avoided.

Embodiments of a flexible display substrate and a method for manufacturing the same according to the present disclosure are described below. The embodiment of the method for manufacturing the flexible display substrate in the present disclosure is illustrated based on the embodiment of the method for manufacturing the flexible substrate described above, and the embodiment of the flexible display substrate in the present disclosure is described based on the embodiment of the flexible substrate described above.

Figure 16:
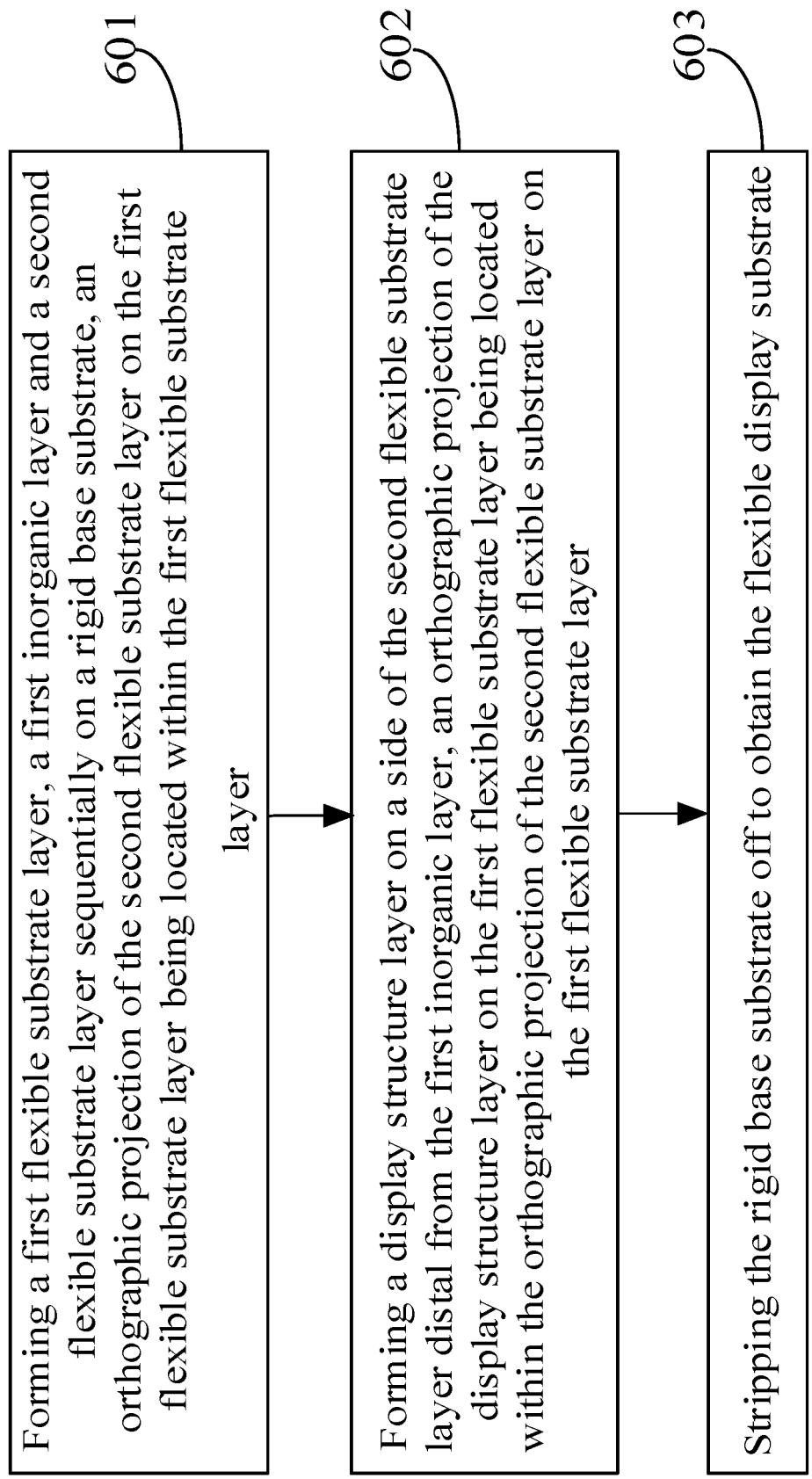
FIG. 16 is a flowchart of a method for manufacturing a flexible display substrate according to an embodiment of the present disclosure.

FIG. 16 is a flowchart of a method for manufacturing a flexible display substrate according to an embodiment of the present disclosure. Referring to FIG. 16, the method includes the following steps.

In step 601, a first flexible substrate layer, a first inorganic layer and a second flexible substrate layer are sequentially formed on a rigid base substrate, an orthographic projection of the second flexible substrate layer on the first flexible substrate layer being located within the first flexible substrate layer.

In step 602, a display structure layer is formed on a side of the second flexible substrate layer distal from the first inorganic layer, an orthographic projection of the display structure layer on the first flexible substrate layer being located within the orthographic projection of the second flexible substrate layer on the first flexible substrate layer.

In step 603, the rigid base substrate is stripped off to obtain the flexible display substrate.

In summary, in the method for manufacturing the flexible display substrate according to the embodiment of the present disclosure, as the first inorganic layer is located on a side of the first flexible substrate layer distal from the rigid base substrate, the second flexible substrate layer is located on the side of the first inorganic layer distal from the first flexible substrate layer, and the orthographic projection of the second flexible substrate layer on the first flexible substrate layer is located within the first flexible substrate layer, during the process of stripping of the rigid base substrate, even if an edge region of the first inorganic layer remains on the rigid base substrate, the second flexible substrate layer does not remain on the rigid base substrate. Thus, a poor process of the flexible substrate is avoided.

Optionally, prior to step 602, the method further includes: forming a second inorganic layer on a side of the second flexible substrate layer distal from the first inorganic layer.

Correspondingly, step 602 includes: forming a display structure layer on a side of the second inorganic layer distal from the second flexible substrate layer.

Optionally, upon the forming the second inorganic layer on the side of the second flexible substrate layer distal from the first inorganic layer, the method further includes: sequentially forming a third flexible substrate layer and a third inorganic layer on the side of the second inorganic layer distal from the second flexible substrate layer, wherein the orthographic projection of the third flexible substrate layer on the first flexible substrate layer is located within the orthographic projection of the second flexible substrate layer on the first flexible substrate layer.

Correspondingly, the forming the display structure layer on the side of the second inorganic layer distal from the second flexible substrate layer includes: forming the display structure layer on a side of the third inorganic layer distal from the third flexible substrate layer, an orthographic projection of the display structure layer on the first flexible substrate layer being located within the orthographic projection of the third flexible substrate layer on the first flexible substrate layer.

Optionally, prior to step 603, the method further includes: forming a encapsulation structure layer on a side of the display structure layer distal from the second flexible substrate layer, the encapsulation structure layer cladding the display structure layer.

Optionally, upon the forming the encapsulation structure layer on the side of the display structure layer distal from the second flexible substrate layer, the method further includes: forming a protective layer on a side of the encapsulation structure layer distal from the display structure layer, wherein the protective layer covers the encapsulation structure layer, and an edge region of the protective layer is bonded to the rigid base substrate.

Optionally, step 603 includes the following sub-steps.

A bonding force between the first flexible substrate layer and the rigid base substrate is removed by a laser lift-off process.

A bonding force between the protective layer and the rigid base substrate is removed by a film stripping process.

Optionally, all of the first flexible substrate layer, the second flexible substrate layer and the third flexible substrate layer are polyimide layers. The thickness of any one of the first flexible substrate layer, the second flexible substrate layer and the third flexible substrate layer is greater than the thickness of any of the first inorganic layer, the second inorganic layer, and the third inorganic layer. The display structure layer is an electroluminescent display structure layer, and the encapsulation structure layer is a thin film encapsulation structure layer.

A forming process of the second flexible substrate layer and the third flexible substrate layer may be referenced to the embodiment shown in FIG. 3, and details thereof are not repeated herein.

All of the above optional technical solutions may form other optional embodiments of the present disclosure in an arbitrary combination thereof, and the description thereof is not repeated herein.

Figure 17:
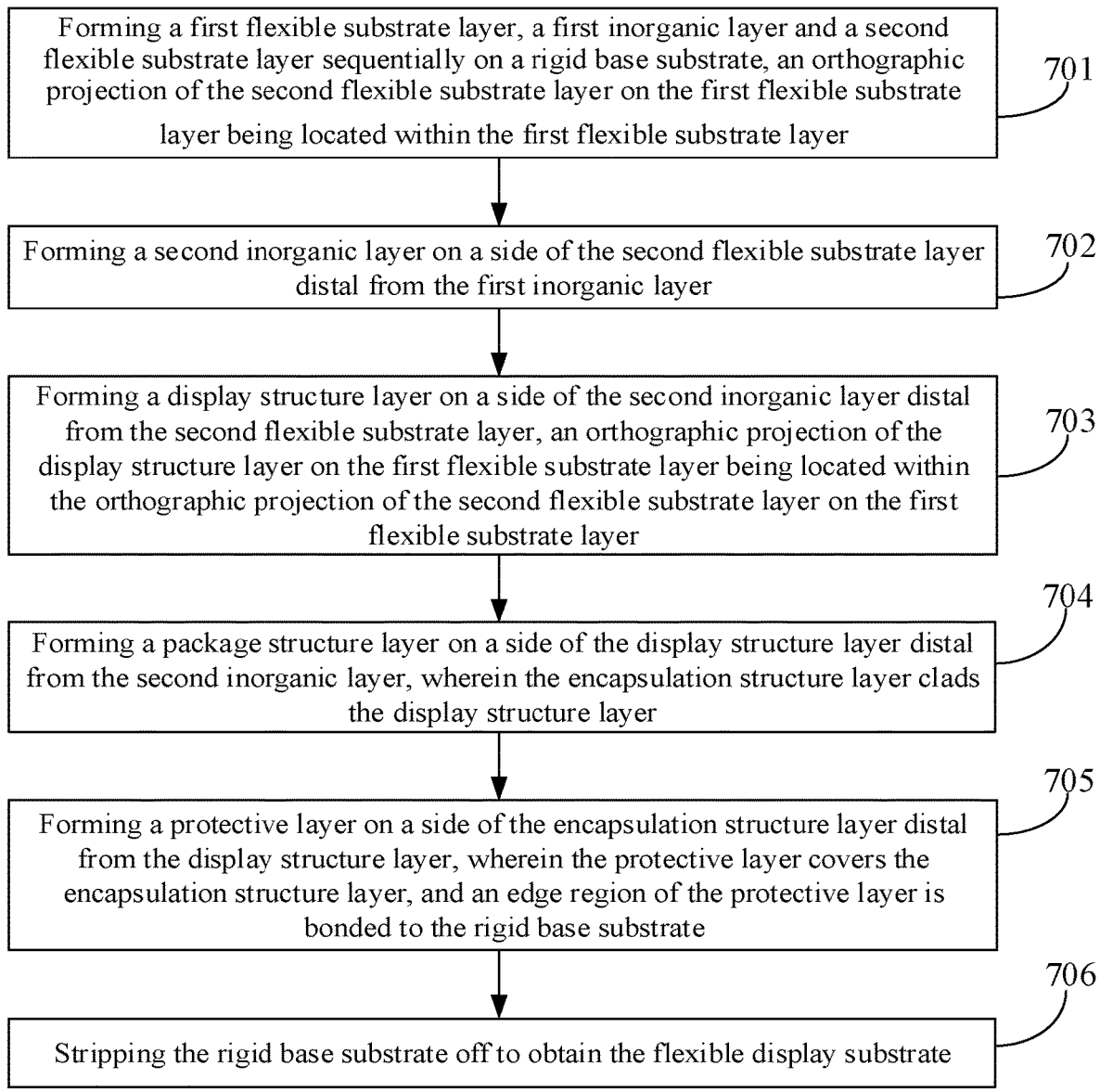
FIG. 17 is a flowchart of a method for manufacturing another flexible display substrate according to an embodiment of the present disclosure.

FIG. 17 is a flowchart of a method for manufacturing another flexible display substrate according to an embodiment of the present disclosure. Referring to FIG. 17, the method includes the following steps.

In step 701, a first flexible substrate layer, a first inorganic layer and a second flexible substrate layer are sequentially formed on a rigid base substrate, an orthographic projection of the second flexible substrate layer on the first flexible substrate layer being located within the first flexible substrate layer.

In step 702, a second inorganic layer is formed on a side of the second flexible substrate layer distal from the first inorganic layer.

An implementation process of steps 701 and 702 may be referenced to that of steps 401 to 403 in the embodiment shown in FIG. 4, and related drawings be referenced to FIG. 5 to FIG. 7, which are not repeated in the embodiment of the present disclosure herein. In this embodiment, the flexible substrate 201 shown in FIG. 7 may be formed by steps 701 and 702.

In step 703, a display structure layer is formed on a side of the second inorganic layer distal from the second flexible substrate layer, an orthographic projection of the display structure layer on the first flexible substrate layer being located within the orthographic projection of the second flexible substrate layer on the first flexible substrate layer.

Figure 18:
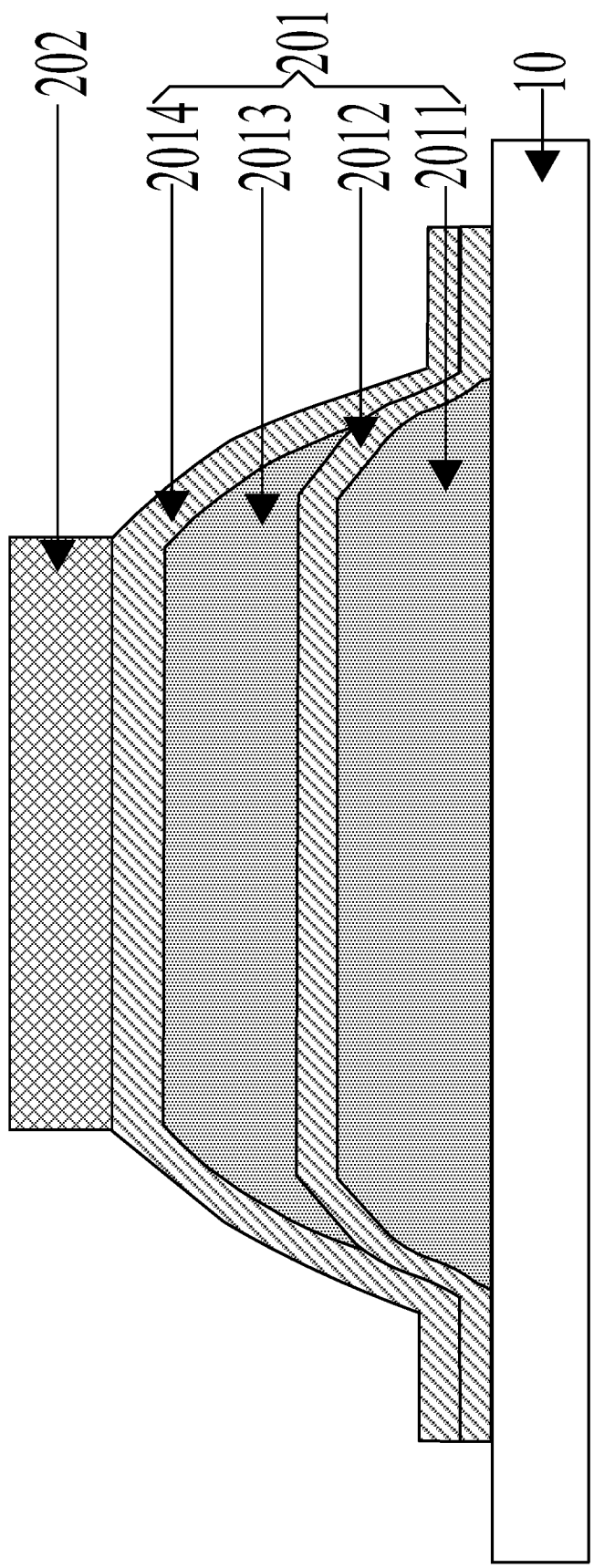
FIG. 18 is a schematic diagram after a display structure layer is formed on a side of the second inorganic layer distal from the second flexible substrate layer according to an embodiment of the present disclosure.

FIG. 18 is a schematic diagram after a display structure layer 202 is formed on a side of the second inorganic layer 2014 distal from the second flexible substrate layer 2013 according to an embodiment of the present disclosure. Forming the display structure layer 202 on the side of the second inorganic layer 2014 distal from the second flexible substrate layer 2013 means that the display structure layer 202 is formed on the side of the flexible substrate 201 shown in FIG. 7 distal from the rigid base substrate 01. As shown in FIG. 18, an orthographic projection of the display structure layer 202 on the first flexible substrate layer 2011 is located within the orthographic projection of the second flexible substrate layer 2013 on the first flexible substrate layer 2011.

The display structure layer 202 may be an electroluminescent display structure layer, and includes a thin film transistor layer (not shown in FIG. 18), an interlayer insulating layer (not shown in FIG. 18) and an electroluminescent device layer (not shown in FIG. 18) which are sequentially distributed in a direction distal from the first flexible substrate layer 2011. The thin film transistor layer may include a grid, a grid insulating layer, an active layer, an interlayer dielectric layer and a source and drain layer which are sequentially distributed in the direction distal from the first flexible substrate layer 2011. The electroluminescent device layer may be, for example, an organic light-emitting diode (OLED) layer or a quantum dot light-emitting diode (QLED) layer, and may include an anode, an electroluminescent layer and a cathode which are sequentially distributed in the direction distal from the first flexible substrate layer 2011.

Optionally, the forming the display structure layer 202 on the side of the second inorganic layer 2014 distal from the second flexible substrate layer 2013 may include: sequentially forming the thin film transistor layer, the interlayer insulating layer and the electroluminescent device layer on the side of the second inorganic layer 2014 distal from the second flexible substrate layer 2013.

In step 704, a encapsulation structure layer is formed on a side of the display structure layer distal from the second inorganic layer, wherein the encapsulation structure layer dads the display structure layer.

Figure 19:
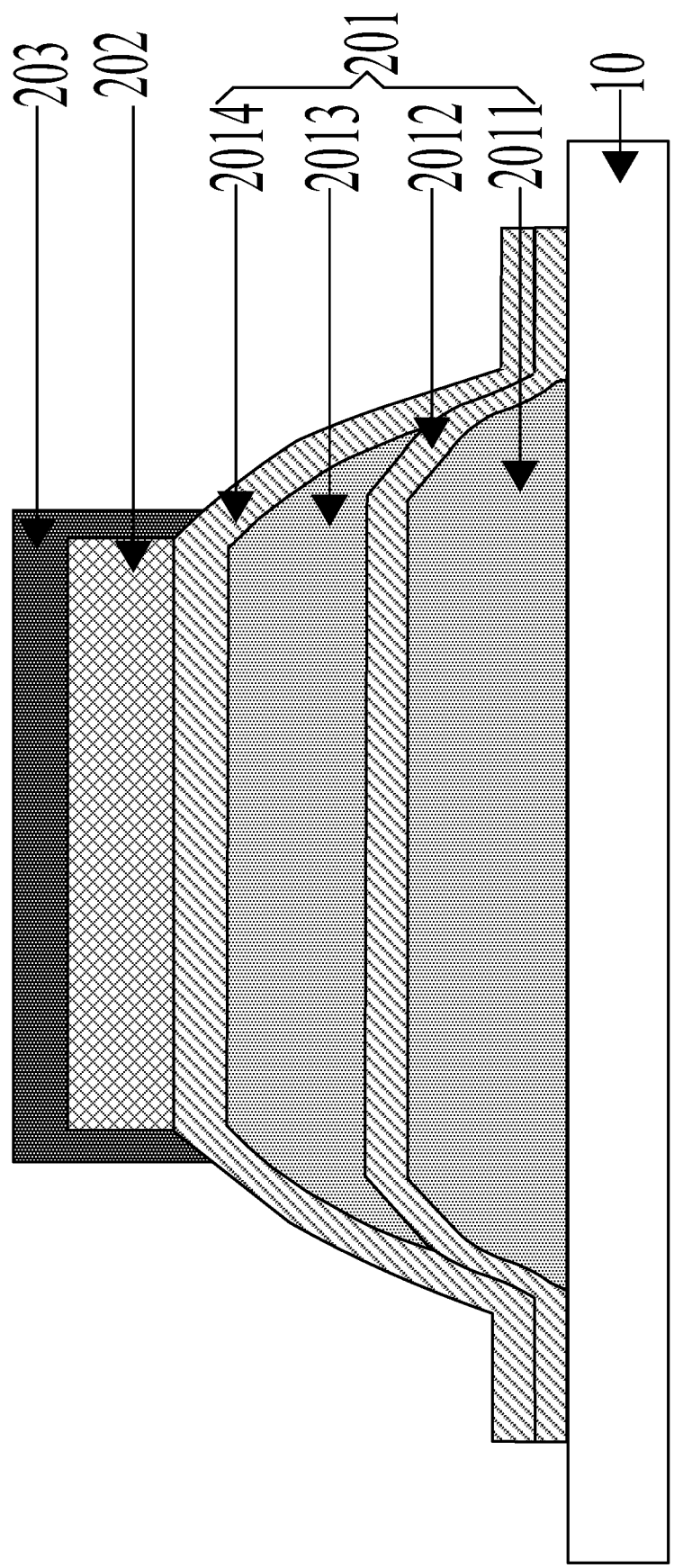
FIG. 19 is a schematic diagram after a encapsulation structure layer is formed on a side of the display structure layer distal from the second inorganic layer according to an embodiment of the present disclosure.

FIG. 19 is a schematic diagram after a encapsulation structure layer 203 is formed on a side of the display structure layer 202 distal from the second inorganic layer 2014 according to an embodiment of the present disclosure. The encapsulation structure layer 203 dads the display structure layer 202. The encapsulation structure layer 203 may be a thin film encapsulation structure layer, and may include inorganic layers and organic layers (not shown in FIG. 19) alternately stacked.

Optionally, forming the encapsulation structure layer 203 on the side of the display structure layer 202 distal from the second inorganic layer 2014 may include: forming the inorganic layers and the organic layers which are alternately stacked on the side of the display structure layer 202 distal from the second inorganic layer 2014 to obtain the encapsulation structure layer 203.

In step 705, a protective layer is formed on a side of the encapsulation structure layer distal from the display structure layer, wherein the protective layer covers the encapsulation structure layer, and an edge region of the protective layer is bonded to the rigid base substrate.

Figure 20:
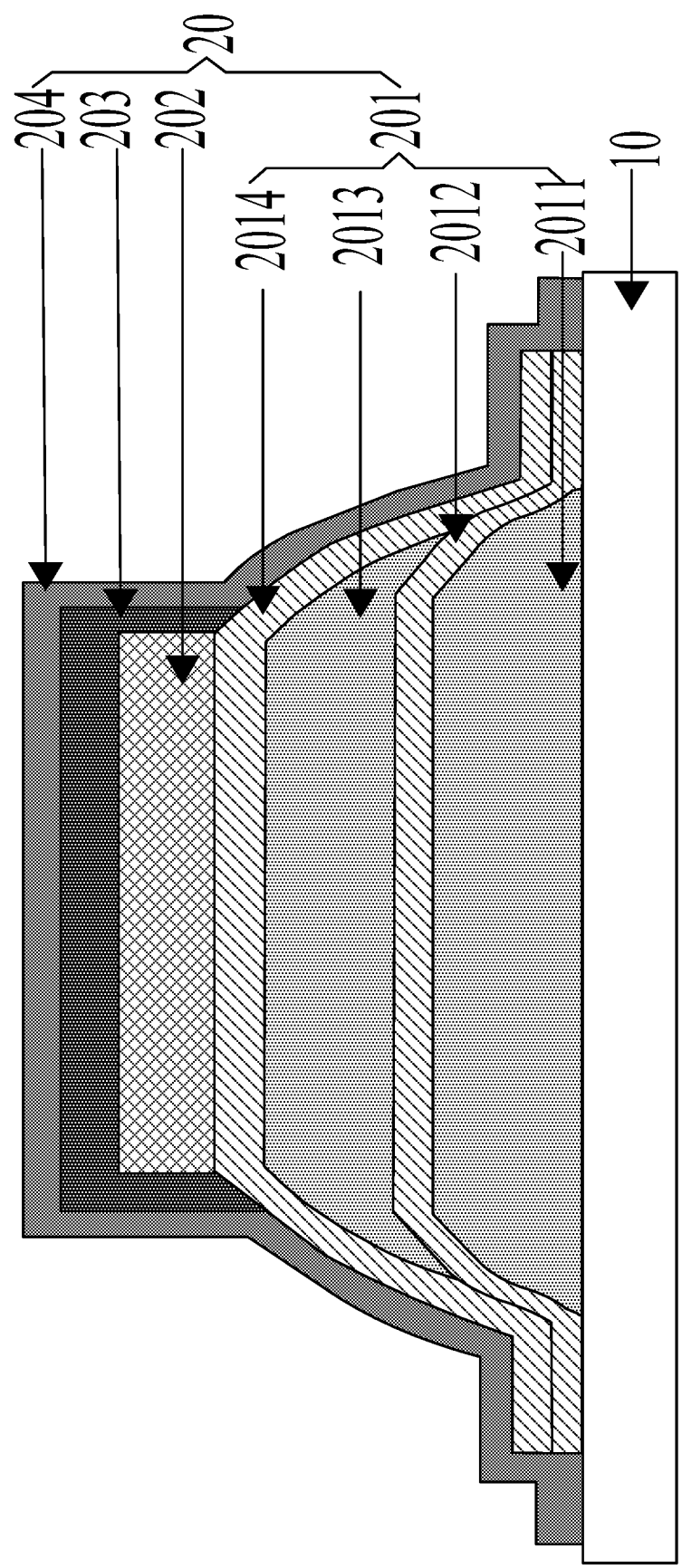
FIG. 20 is a schematic diagram after a protective layer is formed on a side of the encapsulation structure layer distal from the display structure layer according to an embodiment of the present disclosure.

FIG. 20 is a schematic diagram after a protective layer 204 is formed on a side of the encapsulation structure layer 203 distal from the display structure layer 202 according to an embodiment of the present disclosure, the protective layer 204 covering the encapsulation structure layer 203. An edge region of the protective layer 204 is bonded to the rigid base substrate 10. The protective layer 204 may be a top protective film (TPF), and made of an organic material. As shown in FIG. 20, the flexible substrate 201, the display structure layer 202, the encapsulation structure layer 203 and the protective layer 204 form the flexible display substrate 20, wherein the flexible substrate 201 is the flexible substrate as shown in FIG. 9.

Optionally, the forming the protective layer 204 on the side of the encapsulation structure layer 203 distal from the display structure layer 202 may include: forming the protective layer 204 on the side of the encapsulation structure layer 203 distal from the display structure layer 202 by any one of coating, magnetron sputtering, thermal evaporation or PECVD.

Figure 21:
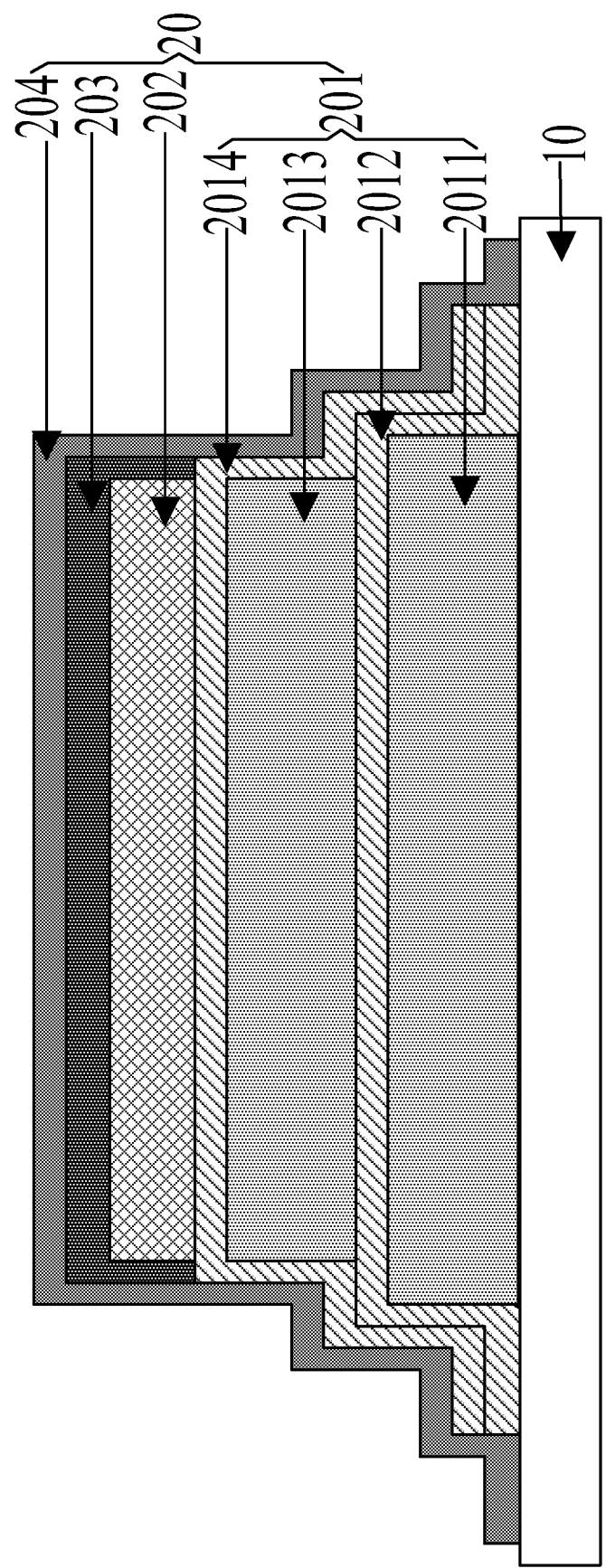
FIG. 21 is a schematic diagram showing an ideal structure of a flexible display substrate according to an embodiment of the present disclosure.

It is readily understood by those skilled in the art that FIG. 18 to FIG. 20 show a schematic diagram of a flexible display substrate in an actual manufacturing process. In the same way as shown in FIG. 8, ideally, the structure obtained by steps 701 to 705 is as shown in FIG. 21, which is not limited in the embodiments of the present disclosure.

In step 706, the rigid base substrate is stripped off to obtain the flexible display substrate.

Figure 22:
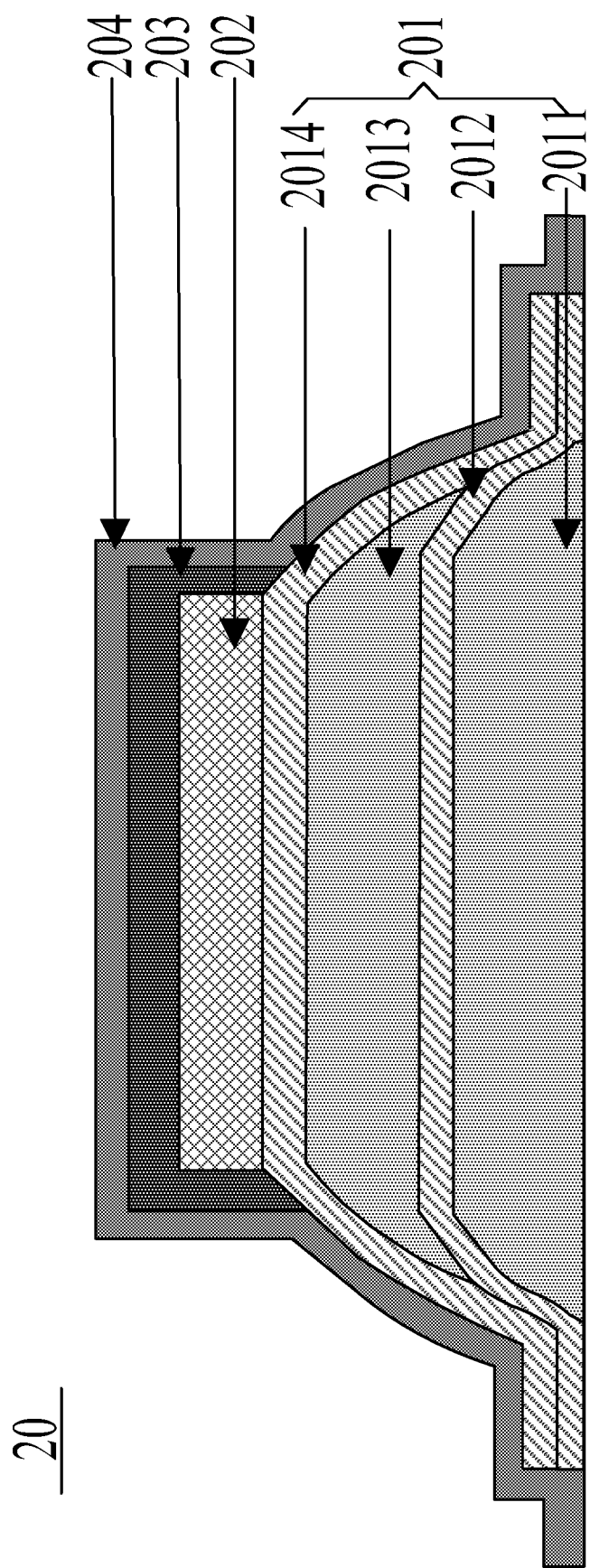
FIG. 22 is a schematic diagram showing an actual structure of the flexible display substrate according to an embodiment of the present disclosure.

The flexible display substrate is obtained after the rigid base substrate 10 is stripped off. FIG. 22 shows a schematic structure diagram of a flexible display substrate 20 according to an embodiment of the present disclosure. The flexible display substrate 20 includes a flexible substrate 201, a display structure layer 202, a encapsulation structure layer 203 and a protective layer 204 that are sequentially stacked. The flexible substrate 201 includes a first flexible substrate layer 2011, a first inorganic layer 2012, a second flexible substrate layer 2013 and a second inorganic layer 2014 that are sequentially stacked. An orthographic projection of the display structure layer 202 on the first flexible substrate layer 2011 is located within the orthographic projection of the second flexible substrate layer 2013 on the first flexible substrate layer 2011. The encapsulation structure layer 203 dads the display structure layer 202; and the protective layer 204 covers the encapsulation structure layer 203.

Optionally, the stripping off the rigid base substrate 10 may include: removing bonding force between the first flexible substrate layer 2011 and the rigid base substrate 10 by an LLO process; and removing bonding force between the protective layer 204 and the rigid base substrate 10 by a film stripping process. A schematic diagram of removing the bonding force between the first flexible substrate layer 2011 and the rigid base substrate 10 by the LLO process may be referenced to FIG. 10; and the film stripping process may be, for example, a delamination (DLM) process.

Figure 23:
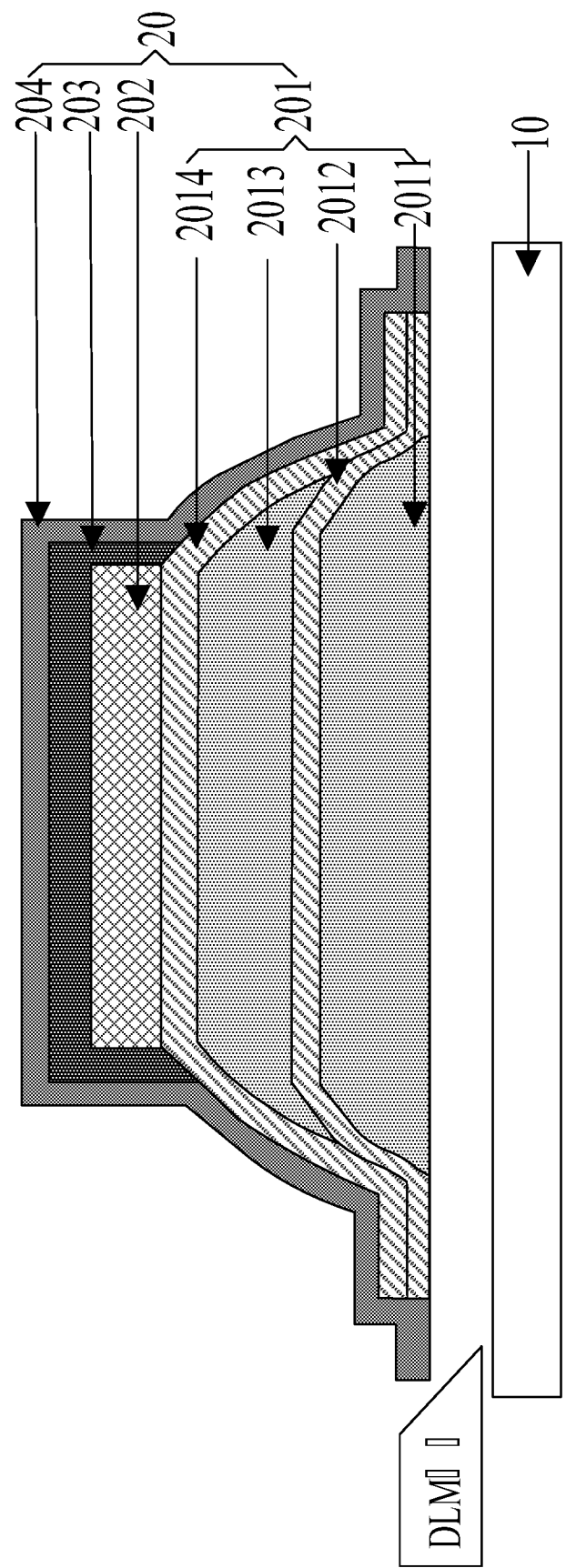
FIG. 23 is a schematic diagram of removing a bonding force between the protective layer and the rigid base substrate by a DLM process according to an embodiment of the present disclosure.

FIG. 23 is a schematic diagram of removing bonding force between the protective layer 204 and the rigid base substrate 10 by a DLM process according to an embodiment of the present disclosure. During the removing, a DLM blade may be inserted between the rigid base substrate 10 and the protective layer 204, wherein the blade surface of the DLM blade is parallel to the plate surface of the rigid base substrate 10. Then, the DLM blade is moved in a direction parallel to the plate surface of the rigid base substrate 10 to remove the bonding force between the protective layer 204 and the rigid base substrate 10 by the DLM blade.

It is readily understood by those skilled in the art that as an area of a bonding surface of the first inorganic layer 2012 and the rigid base substrate 10 is smaller than an area of a bonding surface of the first flexible substrate layer 2011 and the rigid base substrate 10 and an area of a bonding surface of the protective layer 204 and the rigid base substrate 10, after the bonding force between the first flexible substrate layer 2011 and the rigid base substrate 10 and the bonding force between the protective layer 204 and the rigid base substrate 10 are removed, it may be considered that the rigid base substrate 10 is separated from the flexible display substrate 201. In the embodiment of the present disclosure, as the orthographic projection of the second flexible substrate layer 2013 on the first flexible substrate layer 2011 is located within the first flexible substrate layer 2011, it is easy to insert the DLM blade between the rigid base substrate 10 and the protective layer 204. Thus, there is no abnormal separation such as insertion difficulty of the DLM blade in the DLM process. After the first flexible substrate layer 2011 is separated from the rigid base substrate 10, the second flexible substrate layer 2013 is also separated from the rigid base substrate 10. The second flexible substrate layer 2013 does not remain on the rigid base substrate 10, such that no damage is brought to the second flexible substrate layer 2013 in the flexible display substrate 201, and the flexible display substrate 201 is free from a process defect such as a wrinkle or bubble.

It is readily understood by those skilled in the art that the embodiment of the present disclosure is described by taking the flexible display substrate obtained by steps 701 to 706 as an example. In actual applications, a flexible display mother board including a plurality of flexible display substrates may be obtained by steps 701 to 706. Thus, after step 706, the flexible display mother board may be cut to obtain the plurality of flexible display substrates. If the DLM process is abnormal in the process of stripping of the rigid base substrate 10, it is difficult to perform a cutting process normally. In the embodiment of the present disclosure, as there is no abnormal DLM process, the cutting process may be performed normally.

In summary, in the method for manufacturing the flexible display substrate according to the embodiment of the present disclosure, as the first inorganic layer is located on the side of the first flexible substrate layer distal from the rigid base substrate, the second flexible substrate layer is located on the side of the first inorganic layer distal from the first flexible substrate layer, and the orthographic projection of the second flexible substrate layer on the first flexible substrate layer is located within the first flexible substrate layer, during the process of stripping of the rigid base substrate, even if an edge region of the first inorganic layer remains on the rigid base substrate, the second flexible substrate layer does not remain on the rigid base substrate. Thus, a poor process of the flexible substrate is avoided.

Figure 24:
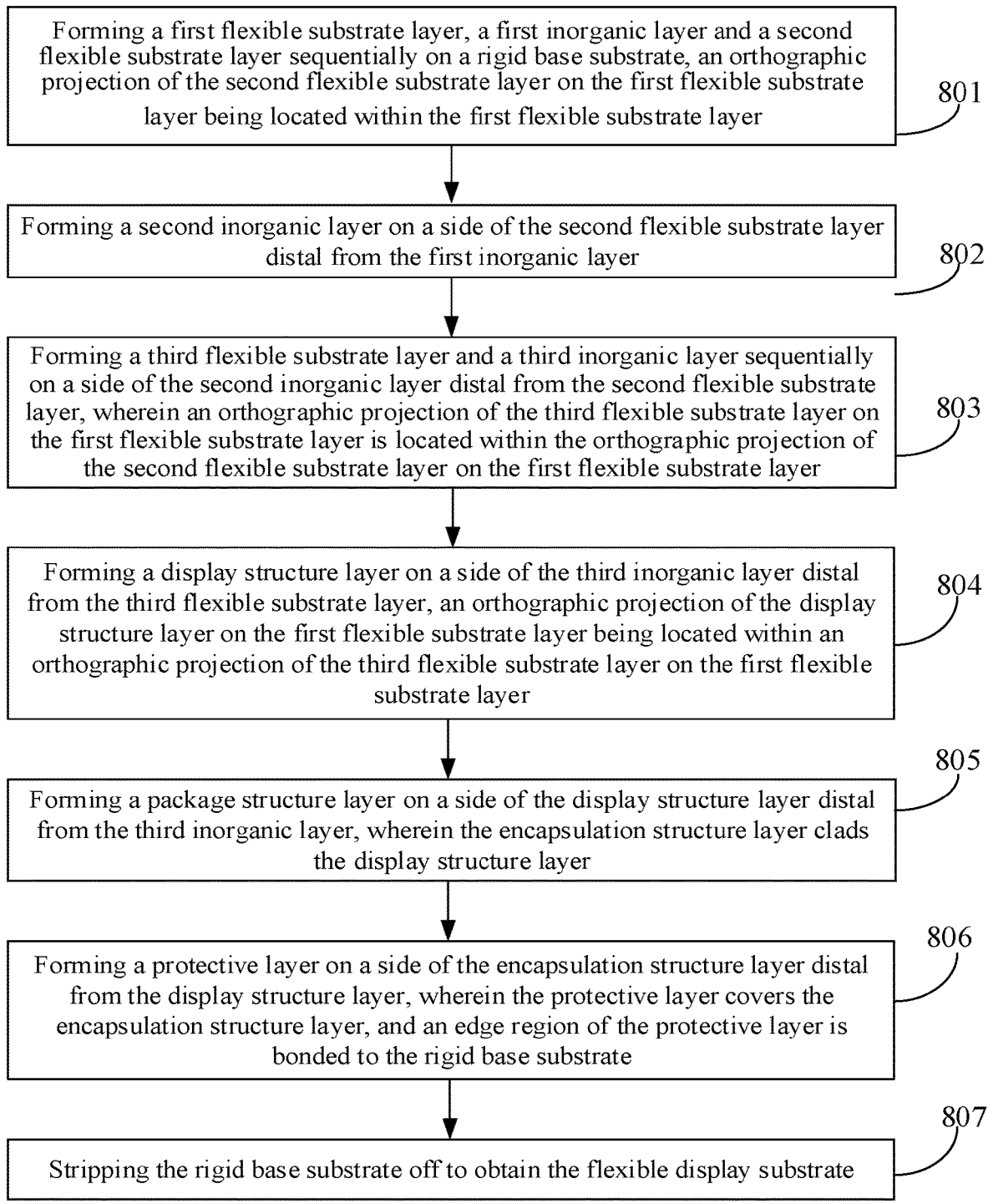
FIG. 24 is a flowchart of a method for manufacturing yet another flexible display substrate according to an embodiment of the present disclosure.

FIG. 24 is a flowchart of a method for manufacturing yet another flexible display substrate according to an embodiment of the present disclosure. Referring to FIG. 24, the method includes the following steps.

In step 801, a first flexible substrate layer, a first inorganic layer and a second flexible substrate layer are sequentially formed on a rigid base substrate, an orthographic projection of the second flexible substrate layer on the first flexible substrate layer being located within the first flexible substrate layer.

In step 802, a second inorganic layer is formed on a side of the second flexible substrate layer distal from the first inorganic layer.

In step 803, a third flexible substrate layer and a third inorganic layer are sequentially formed on a side of the second inorganic layer distal from the second flexible substrate layer, wherein an orthographic projection of the third flexible substrate layer on the first flexible substrate layer is located within the orthographic projection of the second flexible substrate layer on the first flexible substrate layer.

An implementation process of steps 801 and 802 may be reference to that of steps 501 to 505 in the embodiment shown in FIG. 11, and related drawings may be referenced to FIG. 5 to FIG. 7 and FIGS. 12 and 13, which are not repeated in the embodiment of the present disclosure herein. In this embodiment, the flexible substrate 201 shown in FIG. 13 may be formed by steps 801 and 803.

In step 804, a display structure layer is formed on a side of the third inorganic layer distal from the third flexible substrate layer, an orthographic projection of the display structure layer on the first flexible substrate layer being located within an orthographic projection of the third flexible substrate layer on the first flexible substrate layer.

Figure 25:
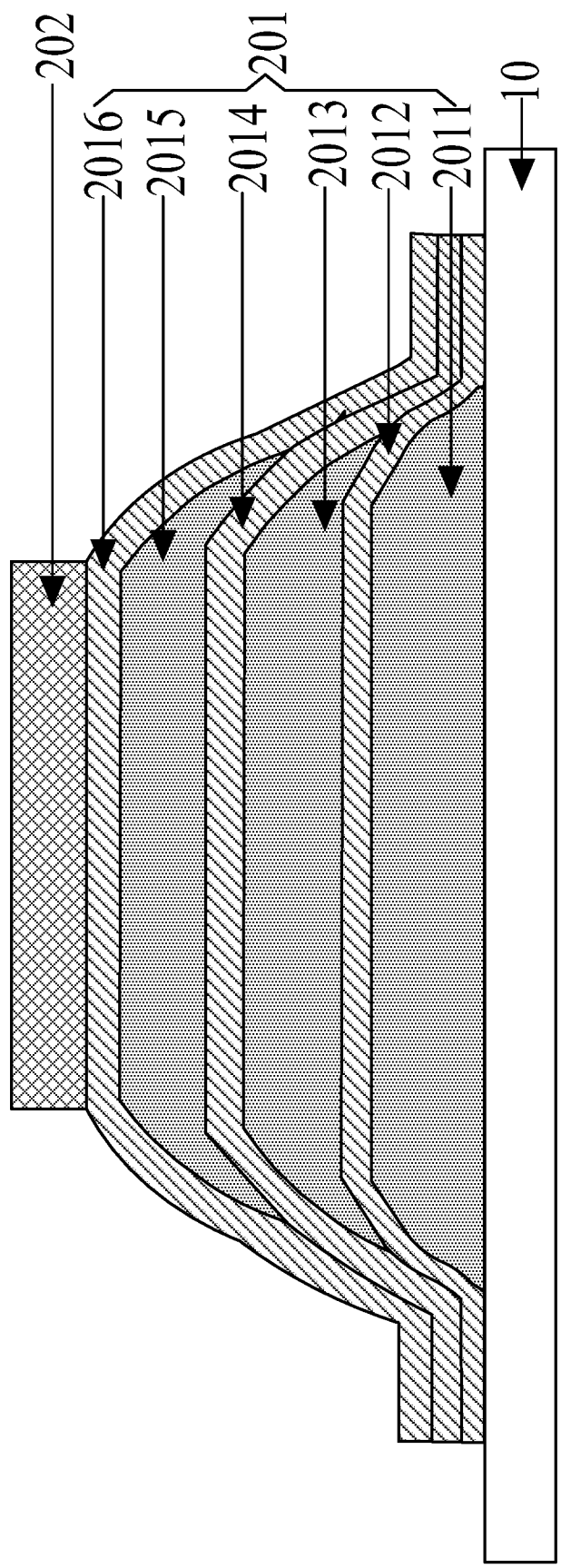
FIG. 25 is a schematic diagram after the display structure layer is formed on a side of the third inorganic layer distal from the third flexible substrate layer according to an embodiment of the present disclosure.

FIG. 25 is a schematic diagram after the display structure layer 202 is formed on the side of the third inorganic layer 2016 distal from the third flexible substrate layer 2015 according to an embodiment of the present disclosure. The orthographic projection of the display structure layer 202 on the first flexible substrate layer 2011 is located within the orthographic projection of the third flexible substrate layer 2015 on the first flexible substrate layer 2011. An implementation process of step 804 may be referenced to step 703 in the embodiment shown in FIG. 17, which is not repeated in the embodiment of the present disclosure herein.

In step 805, a encapsulation structure layer is formed on a side of the display structure layer distal from the third inorganic layer, wherein the encapsulation structure layer dads the display structure layer.

Figure 26:
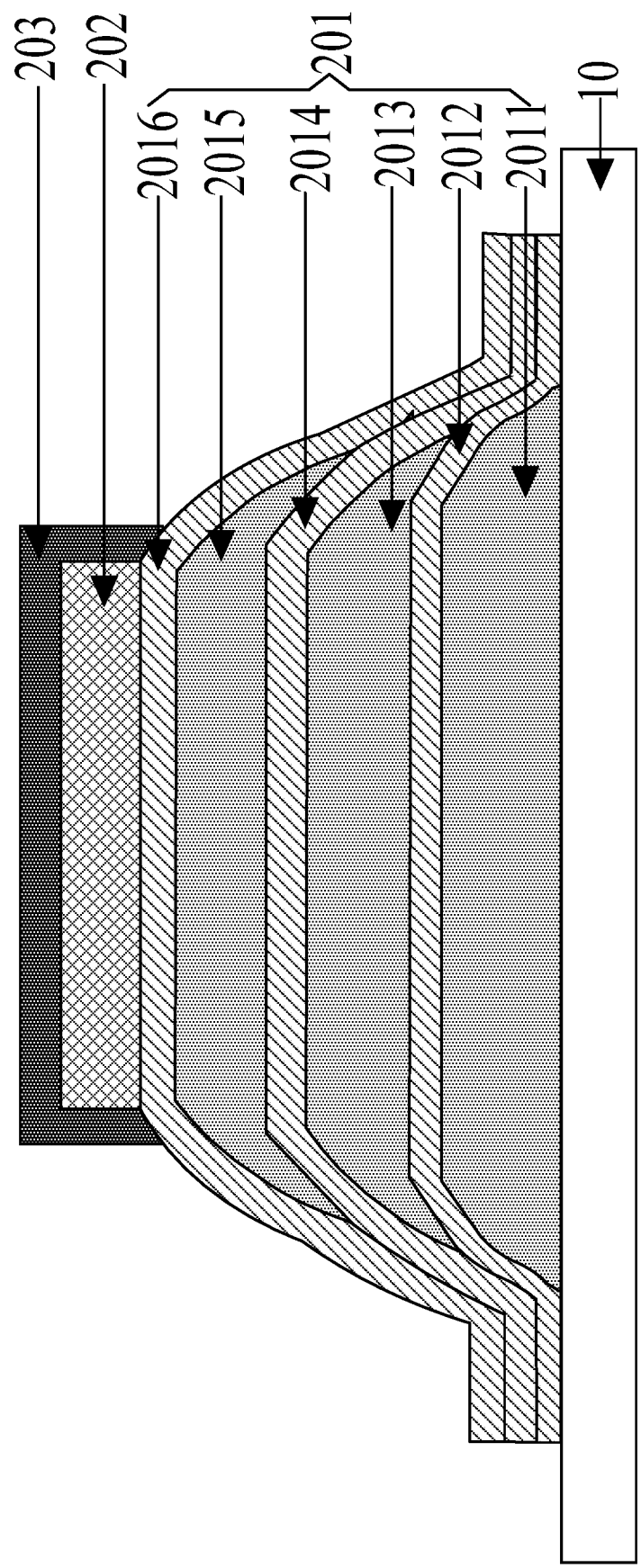
FIG. 26 is a schematic diagram after the encapsulation structure layer is formed on a side of the display structure layer distal from the third inorganic layer according to an embodiment of the present disclosure.

FIG. 26 is a schematic diagram after the encapsulation structure layer 203 is formed on the side of the display structure layer 202 distal from the third inorganic layer 2016 according to an embodiment of the present disclosure. An implementation process of step 805 may be referenced to that of step 704 in the embodiment shown in FIG. 17, which is not repeated in the embodiment of the present disclosure herein.

In step 806, a protective layer is formed on a side of the encapsulation structure layer distal from the display structure layer, wherein the protective layer covers the encapsulation structure layer, and an edge region of the protective layer is bonded to the rigid base substrate.

Figure 27:
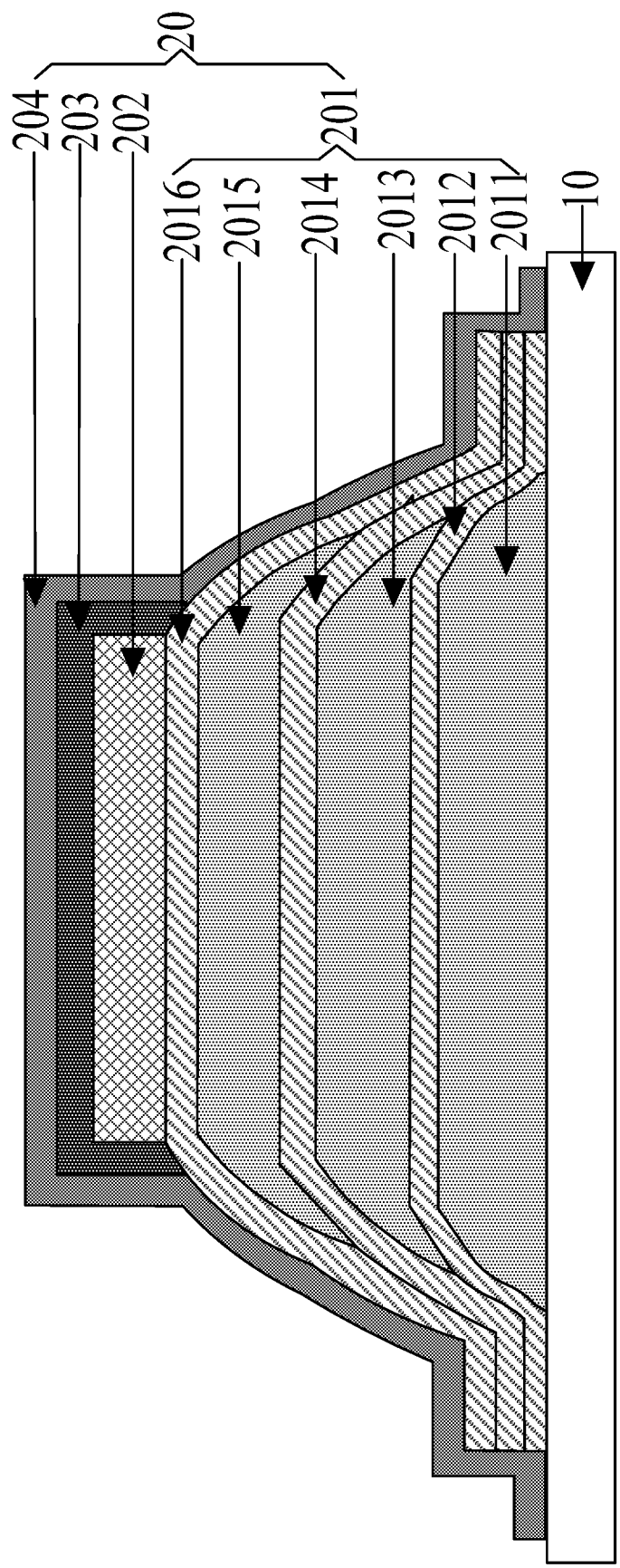
FIG. 27 is a schematic diagram after a protective layer is formed on a side of the encapsulation structure layer distal from the display structure layer according to an embodiment of the present disclosure.

FIG. 27 is a schematic diagram after the protective layer 204 is formed on a side of the encapsulation structure layer 203 distal from the display structure layer 202 according to an embodiment of the present disclosure. An implementation process of step 806 may be referenced to that of step 705 in the embodiment shown in FIG. 17, which is not repeated by the embodiment of the present disclosure herein.

In step 807, the rigid base substrate is stripped off to obtain the flexible display substrate.

Figure 28:
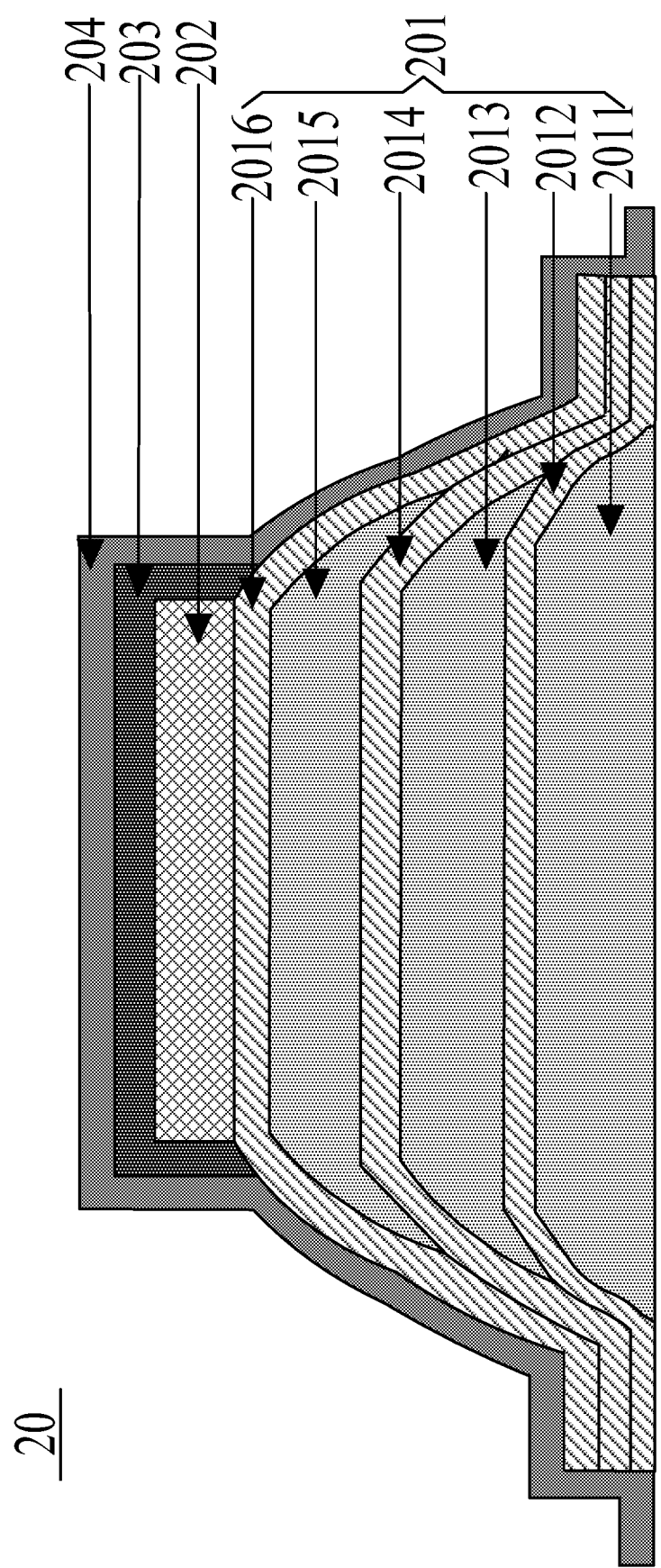
FIG. 28 is a schematic diagram showing an actual structure of another flexible display substrate according to an embodiment of the present disclosure.

FIG. 28 shows a schematic structural diagram of another flexible display substrate 20 according to an embodiment of the present disclosure. The flexible display substrate 20 includes a flexible substrate 201, a display structure layer 202, a encapsulation structure layer 203 and a protective layer 204 that are sequentially stacked. The flexible substrate 201 includes a first flexible substrate layer 2011, a first inorganic layer 2012, a second flexible substrate layer 2013, a second inorganic layer 2014, a third flexible substrate layer 2015 and a third inorganic layer 2016 that are sequentially stacked. An orthographic projection of the display structure layer 202 on the first flexible substrate layer 2011 is located within the orthographic projection of the third flexible substrate layer 2015 on the first flexible substrate layer 2011. The encapsulation structure layer 203 dads the display structure layer 202; and the protective layer 204 covers the encapsulation structure layer 203. An implementation process of step 807 may be referenced to that of step 706 in the embodiment shown in FIG. 17, which is not repeated by the embodiment of the present disclosure herein.

In summary, in the method for manufacturing the flexible display substrate according to the embodiment of the present disclosure, as the first inorganic layer is located on the side of the first flexible substrate layer distal from the rigid base substrate, the second flexible substrate layer is located on the side of the first inorganic layer distal from the first flexible substrate layer, and the orthographic projection of the second flexible substrate layer on the first flexible substrate layer is located within the first flexible substrate layer, during the process of stripping of the rigid base substrate, even if an edge region of the first inorganic layer remains on the rigid base substrate, the second flexible substrate layer does not remain on the rigid base substrate. Thus, a poor process of the flexible substrate is avoided.

Based on the same inventive concept, the embodiment of the present disclosure provide a flexible display substrate which may be the flexible display substrate 20 as shown in FIG. 22 or FIG. 28.

Referring to FIGS. 22 and 28, the flexible display substrate 20 includes: a flexible substrate 201, and a display structure layer 202 located on the flexible substrate 201. The flexible substrate 201 includes a first flexible substrate layer 2011, a first inorganic layer 2012 and a second flexible substrate layer 2013 that are sequentially stacked. The first inorganic layer 2012 covers the first flexible substrate layer 2011. An orthographic projection of the second flexible substrate layer 2013 on the first flexible substrate layer 2011 is located within the first flexible substrate layer 2011. The display structure layer 202 is located on a side of the second flexible substrate layer 2013 distal from the first inorganic layer 2012. An orthographic projection of the display structure layer 202 on the first flexible substrate layer 2011 is located within the orthographic projection of the second flexible substrate layer 2013 on the first flexible substrate layer 2011.

Optionally, as shown in FIGS. 22 and 28, the flexible substrate 201 further includes a second inorganic layer 2014 located between the second flexible substrate layer 2013 and the display structure layer 202. An orthographic projection of the second inorganic layer 2014 on the plane of the first flexible substrate layer 2011 coincides with the orthographic projection of the first inorganic layer 2012 on the plane of the first flexible substrate layer 2011.

Optionally, as shown in FIG. 28, the flexible substrate 201 further includes: a third flexible substrate layer 2015 located between the second inorganic layer 2014 and the display structure layer 202. An orthographic projection of the third flexible substrate layer 2015 on the first flexible substrate layer 2011 is located within the orthographic projection of the second flexible substrate layer 2013 on the first flexible substrate layer 2011. An orthographic projection of the display structure layer 202 on the first flexible substrate layer 2011 is located within the orthographic projection of the third flexible substrate layer 2015 on the first flexible substrate layer 2011. The flexible substrate 201 further includes a third inorganic layer 2016 located between the third flexible substrate layer 2015 and the display structure layer 202. The orthographic projections of the third inorganic layer 2016, the second inorganic layer 2014 and the first inorganic layer 2012 on the plane of the first flexible substrate layer 2011 coincide with one another.

Optionally, referring to FIGS. 22 and 28, the flexible display substrate 20 further includes: a encapsulation structure layer 203 located on a side of the display structure layer 202 distal from the second flexible substrate layer 2013, wherein the encapsulation structure layer 203 dads the display structure layer 202.

Optionally, the flexible display substrate 20 further includes: a protective layer 204 located on a side of the encapsulation structure layer 203 distal from the display structure layer 202, the protective layer 204 covering the encapsulation structure layer 203. As shown in FIGS. 22 and 28, the protective layer 204 further covers the first flexible substrate layer 2011, and may be a TPF.

Optionally, in the embodiment of the present disclosure, all of the first flexible substrate layer 2011, the second flexible substrate layer 2013 and the third flexible substrate layer 2015 are PI layers. The thickness of any one of the first flexible substrate layer 2011, the second flexible substrate layer 2013 and the third flexible substrate layer 2015 is greater than the thickness of any of the first inorganic layer 2012, the second inorganic layer 2014 and the third inorganic layer 2016.

Optionally, the display structure layer 202 may be an electroluminescent display structure layer, and includes a thin film transistor layer, an interlayer insulating layer and an electroluminescent device layer which are sequentially distributed in a direction distal from the first flexible substrate layer 2011. The encapsulation structure layer 203 is a thin film encapsulation structure layer including inorganic layers and organic layers alternately stacked. The thin film transistor layer may include a grid, a grid insulating layer, an active layer, an interlayer dielectric layer and a source and drain layer which are sequentially distributed in the direction distal from the first flexible substrate layer 2011. The electroluminescent device layer may be, for example, an OLED layer or a QLED layer, and may include an anode, an electroluminescent layer and a cathode which are sequentially distributed in the direction distal from the first flexible substrate layer 2011. Nevertheless, the display structure layer 202 may further include other structures, which are not repeated in the embodiment of the present disclosure herein.

It is readily understood by those skilled in the art that the embodiments of the flexible display substrate and the method for manufacturing the same according to the present disclosure may refer to each other. Details not disclosed in the embodiment of the flexible display substrate may be referenced to the embodiment of the method for manufacturing the flexible display substrate, which are not repeated herein.

In summary, in the flexible display substrate according to the embodiment of the present disclosure, as the first inorganic layer is located on the side of the first flexible substrate layer distal from the rigid base substrate, the second flexible substrate layer is located on the side of the first inorganic layer distal from the first flexible substrate layer, and the orthographic projection of the second flexible substrate layer on the first flexible substrate layer is located within the first flexible substrate layer, during the process of manufacturing the flexible display substrate, even if an edge region of the first inorganic layer remains on the rigid base substrate, the second flexible substrate layer does not remain on the rigid base substrate. Thus, a poor process of the flexible display substrate is avoided.

In the embodiments of the present disclosure, the thickness refers to the maximum size in a direction perpendicular to a plate surface of the rigid base substrate. For example, the thickness of the flexible substrate layer (e.g., the first flexible substrate layer 2011) refers to the maximum size of the flexible substrate layer in the direction perpendicular to the plate surface of the rigid base substrate 10. The thickness of the inorganic layer (e.g., the first inorganic layer 2012) refers to the maximum size of the inorganic layer in the direction perpendicular to the plate surface of the rigid base substrate 10.

In the method for manufacturing the flexible substrate and the method for manufacturing the flexible display substrate according to the embodiments of the present disclosure, the order of the steps may be appropriately adjusted, and the steps may be correspondingly increased or decreased as needed. Changed methods which may be easily expected by any person skilled in the art within the technical scope disclosed by the present disclosure should be covered by the protection scope of the present disclosure, and thus are not repeated herein.

Based on the same inventive concept, the embodiment of the present disclosure further provides a display device which may be a flexible display device and which includes the flexible display substrate according to the above embodiments. The display device may be electronic paper, a mobile phone, a tablet computer, a TV, a display, a notebook computer, a digital photo frame, a navigator, a wearable device, or any product or component having a display function.

The term "first" or "second" used in the present disclosure is merely used to describe but not denote or imply any relative importance. The term "a plurality of" means two or more, unless otherwise expressly provided.

It should be understood by those skilled in the art that, all or part of the steps of the above embodiments may be implemented by hardware, or by programs that give instructions to respective hardware. The programs may be stored in a computer-readable storage medium which may be a read-only memory, a magnetic disk or an optical disk or the like.

Described above are merely optional embodiments of the present disclosure, and are not intended to limit the present disclosure. Within the spirit and principles of the disclosure, any modifications, equivalent substitutions, or improvements are within the protection scope of the present disclosure.

The invention claimed is:

1. A method for manufacturing a flexible substrate, comprising:
   sequentially forming a first flexible substrate layer and a first inorganic layer on a rigid base substrate;
   forming a second flexible substrate layer on a side of the first inorganic layer distal from the first flexible substrate layer, an orthographic projection of the second flexible substrate layer on the first flexible substrate layer being located within the first flexible substrate layer;
   forming a second inorganic layer on a side of the second flexible substrate layer distal from the first inorganic layer; and
   stripping off the rigid base substrate to obtain the flexible substrate,
   wherein the first inorganic layer coats the first flexible substrate layer, and the second inorganic layer coats the second flexible substrate layer and the first flexible substrate layer, the first and second flexible substrate layers do not extend to a boundary position of the flexible substrate and only a stack of the first inorganic layer and the second inorganic layer remains at the boundary position.

2. The method according to claim 1, wherein the forming the second flexible substrate layer on the side of the first inorganic layer distal from the first flexible substrate layer, the orthographic projection of the second flexible substrate layer on the first flexible substrate layer being located within the first flexible substrate layer comprises:
   forming a first substrate solution layer on the side of the first inorganic layer distal from the first flexible substrate layer, an area of the first substrate solution layer being smaller than an area of the first flexible substrate layer, and an orthographic projection of the first substrate solution layer on the first flexible substrate layer being located within the first flexible substrate layer; and
   drying the first substrate solution layer to obtain the second flexible substrate layer.

3. The method of claim 1, wherein upon the forming the second inorganic layer on the side of the second flexible substrate layer distal from the first inorganic layer, the method further comprises:
   forming a third flexible substrate layer on a side of the second inorganic layer distal from the second flexible substrate layer, an orthographic projection of the third flexible substrate layer on the first flexible substrate layer being located within the orthographic projection of the second flexible substrate layer on the first flexible substrate layer; and
   forming a third inorganic layer on a side of the third flexible substrate layer distal from the second inorganic layer.

4. The method according to claim 3, wherein the forming the third flexible substrate layer on the side of the second inorganic layer distal from the second flexible substrate layer comprises:
   forming a second substrate solution layer on the side of the second inorganic layer distal from the second flexible substrate layer, an area of the second substrate solution layer being smaller than an area of the second flexible substrate layer, and an orthographic projection of the second substrate solution layer on the first flexible substrate layer being located within the orthographic projection of the second flexible substrate layer on the first flexible substrate layer; and drying the second substrate solution layer to obtain the third flexible substrate layer.

5. The method according to claim 1, wherein
upon the forming the second flexible substrate layer on the side of the first inorganic layer distal from the first flexible substrate layer, the method further comprises:
sequentially forming a third flexible substrate layer and a third inorganic layer on the side of the second flexible substrate layer distal from the first inorganic layer, an orthographic projection of the third flexible substrate layer on the first flexible substrate layer being located within the orthographic projection of the second flexible substrate layer on the first flexible substrate layer.

6. A flexible substrate, comprising:
a first flexible substrate layer, a first inorganic layer, a second flexible substrate layer, and a second inorganic layer that are sequentially stacked, wherein an orthographic projection of the second flexible substrate layer on the first flexible substrate layer is located within the first flexible substrate layer, the first inorganic layer coats the first flexible substrate layer, and the second inorganic layer coats the second flexible substrate layer and the first flexible substrate layer;
wherein the first and second flexible substrate layers do not extend to a boundary position of the flexible substrate and only a stack of the first inorganic layer and the second inorganic layer remains at the boundary position.

7. The flexible substrate according to claim 6, further comprising:
a third flexible substrate layer located on a side of the second inorganic layer distal from the second flexible substrate layer, an orthographic projection of the third flexible substrate layer on the first flexible substrate layer being located within the orthographic projection of the second flexible substrate layer on the first flexible substrate layer; and
a third inorganic layer located on a side of the third flexible substrate layer distal from the second inorganic layer.

8. A method for manufacturing a flexible display substrate, the method comprising:
sequentially forming a first flexible substrate layer, a first inorganic layer, and a second flexible substrate layer on a rigid base substrate, an orthographic projection of the second flexible substrate layer on the first flexible substrate layer being located within the first flexible substrate layer;
forming a second inorganic layer on the side of the second flexible substrate layer distal from the first inorganic layer;
forming a display structure layer on a side of the second flexible substrate layer distal from the first inorganic layer, an orthographic projection of the display structure layer on the first flexible substrate layer being located within the orthographic projection of the second flexible substrate layer on the first flexible substrate layer; and
stripping off the rigid base substrate to obtain the flexible display substrate,
wherein the first inorganic layer coats the first flexible substrate layer, and the second inorganic layer coats the second flexible substrate layer and the first flexible substrate layer, the first and second flexible substrate layers do not extend to a boundary position of the flexible substrate and only a stack of the first inorganic layer and the second inorganic layer remains at the boundary position.

9. The method according to claim 8, wherein
forming the display structure layer on the side of the second flexible substrate layer distal from the first inorganic layer comprises:
forming the display structure layer on a side of the second inorganic layer distal from the second flexible substrate layer.

10. The method according to claim 9, wherein
upon the forming the second inorganic layer on the side of the second flexible substrate layer distal from the first inorganic layer, the method further comprises:
sequentially forming a third flexible substrate layer and a third inorganic layer on the side of the second inorganic layer distal from the second flexible substrate layer, an orthographic projection of the third flexible substrate layer on the first flexible substrate layer being located within the orthographic projection of the second flexible substrate layer on the first flexible substrate layer; and
the forming the display structure layer on the side of the second inorganic layer distal from the second flexible substrate layer comprises:
forming the display structure layer on a side of the third inorganic layer distal from the third flexible substrate layer, an orthographic projection of the display structure layer on the first flexible substrate layer being located within the orthographic projection of the third flexible substrate layer on the first flexible substrate layer.

11. The method according to claim 8, wherein prior to the stripping off the rigid base substrate, the method further comprises:
forming an encapsulation structure layer on a side of the display structure layer distal from the second flexible substrate layer, the encapsulation structure layer cladding the display structure layer.

12. The method according to claim 8, wherein
prior to the forming the display structure layer on the side of the second flexible substrate layer distal from the first inorganic layer, the method further comprises:
sequentially forming a third flexible substrate layer and a third inorganic layer on the side of the second flexible substrate layer distal from the first inorganic layer, an orthographic projection of the third flexible substrate layer on the first flexible substrate layer being located within the orthographic projection of the second flexible substrate layer on the first flexible substrate layer;
the forming the display structure layer on the side of the second flexible substrate layer distal from the first inorganic layer comprises:
forming the display structure layer on a side of the third inorganic layer distal from the first inorganic layer; and
upon the forming the display structure layer on the side of the third inorganic layer distal from the first inorganic layer, the method further comprises:
sequentially forming an encapsulation structure layer and a protective layer on the side of the display structure layer distal from the second flexible substrate layer, the encapsulation structure layer cladding the display structure layer.

13. A flexible display substrate, comprising: the flexible substrate as defined in claim 6, and a display structure layer located on the flexible substrate; wherein the flexible substrate comprises the first flexible substrate layer, the first inorganic layer and the second flexible substrate layer that are sequentially stacked, an orthographic projection of the second flexible substrate layer on the first flexible substrate layer being located with the first flexible substrate layer; the display structure layer is located on a side of the second flexible substrate layer distal from the first inorganic layer; and an orthographic projection of the display structure layer on the first flexible substrate layer is located within the orthographic projection of the second flexible substrate layer on the first flexible substrate layer.

14. The flexible display substrate according to claim 13, wherein the second inorganic layer is located between the second flexible substrate layer and the display structure layer.

15. The flexible display substrate according to claim 14, further comprising:

a third flexible substrate layer located between the second inorganic layer and the display structure layer, an orthographic projection of the third flexible substrate layer on the first flexible substrate layer being located within the orthographic projection of the second flexible substrate layer on the first flexible substrate layer, and an orthographic projection of the display structure layer on the first flexible substrate layer being located within the orthographic projection of the third flexible substrate layer on the first flexible substrate layer; and a third inorganic layer located between the third flexible substrate layer and the display structure layer.

16. The flexible display substrate according to claim 13, further comprising:

an encapsulation structure layer located on a side of the display structure layer distal from the flexible substrate, the encapsulation structure layer cladding the display structure layer.

17. The flexible display substrate according to claim 13, wherein the flexible substrate further comprises:

the second inorganic layer located between the second flexible substrate layer and the display structure layer, a third flexible substrate layer located between the second inorganic layer and the display structure layer, an orthographic projection of the third flexible substrate layer on the first flexible substrate layer being located within the orthographic projection of the second flexible substrate layer on the first flexible substrate layer, and an orthographic projection of the display structure layer on the first flexible substrate layer being located within the orthographic projection of the third flexible substrate layer on the first flexible substrate layer, and a third inorganic layer located between the third flexible substrate layer and the display structure layer; and the flexible display substrate further comprises:

an encapsulation structure layer located on a side of the display structure layer distal from the flexible substrate, the encapsulation structure layer cladding the display structure layer, and a protective layer located on a side of the encapsulation structure layer distal from the display structure layer.

18. A display device, comprising: the flexible display substrate as defined in claim 13.

* * * * *